United States Patent [19]

Reeb

[11] Patent Number: 4,792,790
[45] Date of Patent: Dec. 20, 1988

[54] IDENTIFICATION DEVICE IN THE FORM OF A TAG-LIKE STRIP AFFIXABLE TO AN ARTICLE AND METHOD FOR ITS MANUFACTURE

[76] Inventor: Max E. Reeb, Mozartstr. 29, D-7320 Göppingen, Fed. Rep. of Germany

[21] Appl. No.: 908,901

[22] Filed: Sep. 18, 1986

Related U.S. Application Data

[63] Continuation of Ser. No. 598,086, Jan. 31, 1984, abandoned.

[30] Foreign Application Priority Data

Jun. 7, 1982 [DE] Fed. Rep. of Germany ....... 3221500

[51] Int. Cl.[4] .............................................. G08B 13/18
[52] U.S. Cl. ........................................ 340/572; 29/846
[58] Field of Search ................... 340/572; 29/595, 846, 29/DIG. 16, DIG. 40

[56] References Cited

U.S. PATENT DOCUMENTS 4,369,557 1/1983 Vandebult ........................... 340/572
4,694,283 9/1987 Reeb .................................... 340/572

Primary Examiner—Glen R. Swann, III

[57] ABSTRACT

The identification device in the form of a tag-like construction affixable to an object has at least one inductive element formed of flat conductor paths and a capacitive element formed from overlapping by overlaying conductor path parts and an interposed dielectric, which forms with the inductive element a closed resonant circuit, the conductor paths being arranged in at least two superimposed surfaces by folding together. In this way the conductor path parts forming the capacitive element are superimposed and they are at least partially identical with the conductor path parts forming the inductive element. In the method for the manufacture of the identification arrangement in the form of a tag-like construction affixable to an object, the conductor path constructions are arranged on an endless carrier path and the folding together of the conductor path construction is effected in that a continuously executed folding of the carrier path is carried out along a perforation line or fold-line.

58 Claims, 19 Drawing Sheets

FIG. 5

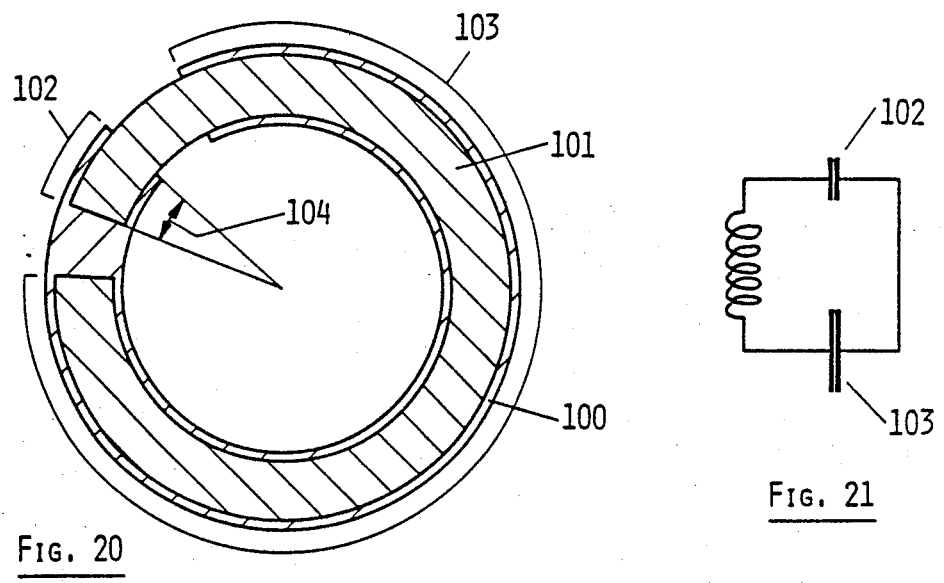
Fig. 20
Fig. 21
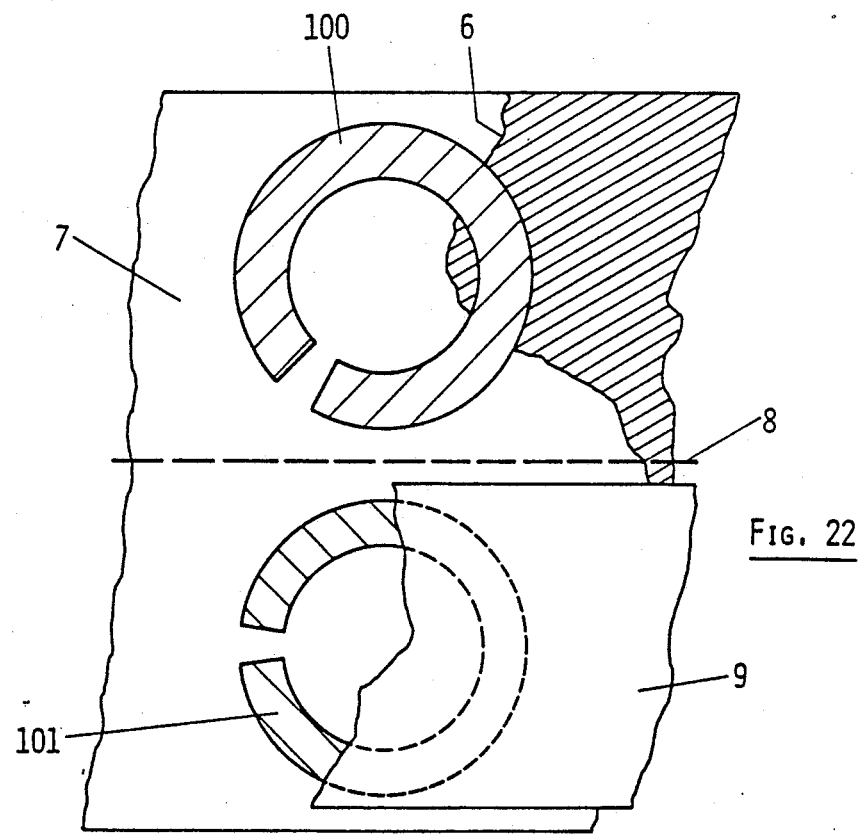
Fig. 22

IDENTIFICATION DEVICE IN THE FORM OF A TAG-LIKE STRIP AFFIXABLE TO AN ARTICLE AND METHOD FOR ITS MANUFACTURE

This application is a continuation of application Ser. No. 598,086 filed Jan. 31, 1984.

BACKGROUND AND SUMMARY OF THE INVENTION

The invention relates to an identification arrangement or device in the form of a label-like or tag-like structure affixable to an article and comprising at least one inductive element formed from planar conductive paths and a capacitive element formed from superimposed conductive path parts and a dielectric interposed therebetween, which forms a closed resonant circuit with the inductive element, the conductive paths being arranged in at least two surfaces which are superimposed by folding together, as well as to a method for its manufacture.

From German Auslegeschrift No. 28 26 861 identification arrangements or devices are already known which essentially contain an electrical parallel resonant circuit and are arranged to produce in a high frequency electromagnetic field characteristic signals which enable their recognition. Such passive identification arrangements are utilized as security elements and as recognition sensors in merchandise security systems, in particular theft security systems.

If such arrangements are required in very large quantities, the manufacturing costs of such arrangements as well as their handling costs play a wholly decisive role in the economic use of the system. A substantial reduction of handling costs is possible by one-time use of such arrangements; an important prerequisite for this is extremely low manufacturing costs.

From German Offenlegungsschrift No. 25 23 002, tag-like identification arrangements are known which are manufactured in that conductive paths are etched out of various strong metal foils which are laminated on both sides of a flexible electrically insulating carrier foil. The etched-out conductive paths form the inductive element, whilst the capacitive element is formed by stamped out conductive surfaces which lie opposite one another and are mutually separated by the intermediate insulating carrier foil. Since after the etching the conductive path regions on both sides of the carrier foil have no conductive connection with each other, such a connection must be performed in a suitable manner in the form of a through-contact through the thin and elastic carrier foil. This process is complicated from the point of view of manufacturing technology, occupies a relatively long time, and does not produce a satisfactory durable contact, as continual investigations of arrangements made in such manner show. In addition, the double-sided etching process—particularly with simultaneous processing of layers of various thicknesses—is expensive. The through contact region cannot be imprinted as it would be damaged.

There are moreover limitations to the known method of manufacture in that the dielectric layer used therein cannot be made arbitrarily thin because during the etching process it must, as carrying substrate, have a certain minimum stability. This leads to relatively large metal surfaces as capacitor layers which limit the resonant quality of such constructions as a result of the eddy current losses caused thereby and sets thereby a limit to arbitrary miniaturization of such arrangements.

The identification arrangement mentioned in the introduction is already known from German Offenlegungsschrift No. 31 43 208.5.

The invention is based on the idea of arranging conductive paths by folding together of a conductor path construction which is connected or divided into at least two parts, at least partially overlapping and/or crossing over one another in such manner that in each case performance of a contact is not necessary and the necessary resonant circuit capacitance of such a resonant construction is formed by selective introduction of dielectric layers between conductive path parts folded on each other in concentrated or distributed form. Since not only the conductive paths but also the dielectric layers can be made very thin, the thickness of a finished identification arrangement is also very small without the need to forego sufficient circuit inductance and circuit capacitance.

An object of the invention is to create an identification arrangement and a method for its manufacture which on the one hand enable economically favourable mass-production so that such identification arrangements are suitable for one-way use, and on the other hand provide sufficiently low tolerances of the resonant frequency and resonant quality and a high reliability through the absence of contacts pressed through an insulating foil.

This object is achieved in that the conductor path parts forming the capacitive element mutually overlap and are identical to at least some extent with the conductor paths forming the inductive element.

Further advantageous embodiments of the identification arrangement according to the invention are described in claims 2 to 28.

The various embodiments of the method according to the invention are described in claims 29 to 42.

The identification arrangement according to the invention is applicable particularly to security and control systems such as merchandising security systems, object security systems, document security systems, entry control systems, event control systems (e.g. parking systems), data security systems and permit control systems.

BRIEF DESCRIPTION OF THE DRAWINGS

Embodiments of the invention are described in more detail with reference to the drawings in which:

FIG. 5 shows a schematic representation of an embodiment of a fixed conductor path construction for the manufacture of a tag-like construction according to the invention having substantially mutually overlapping conductor paths;

FIG. 20 shows a schematic representation for explanation of the principle of a substantially annular tag-like construction according to the invention which can be made circular;

FIG. 21 shows an equivalent circuit diagram of the conductor path construction illustrated in FIG. 20;

FIG. 22 shows a schematic representation of the manufacture of embodiments of the invention having substantially annular conductor path construction;

DETAILED DESCRIPTION OF THE PREFERRED EMBODIMENTS

Figure 1:
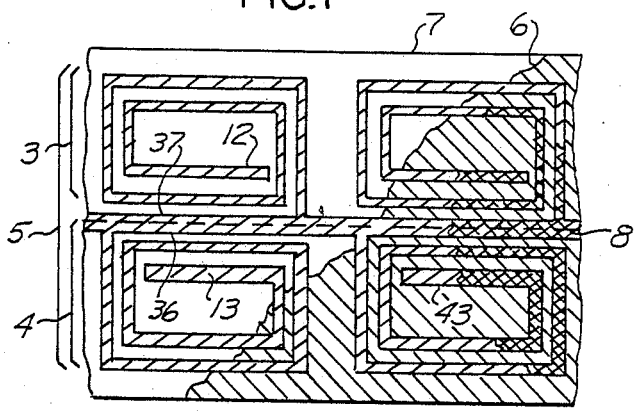
FIG. 1 shows a schematic representation for explanation of the continuous manufacture of tag-like constructions having two planes folded together, two tag-like identification arrangements in the course of production being represented by way of example.

The central component of the identification arrangement in the form of a tag according to the invention is an electrical component which represents a parallel resonant circuit with high coupling to surrounding fields and is formed from an inductive element and a capacitive element, the latter being constructed in a few preferred embodiments partly along the inductive construction in the form of a strip line conductor.

This identification arrangement may be considered for the equipping of merchandise identification tags, security tags and control tags since it can be manufactured particularly quickly and easily and with the smallest possible wastage of raw material and makes use of raw materials which can be manufactured simply and economically favourably.

First of all an embodiment of an effective electrical component of such an identification arrangement will be described.

In the embodiment represented in FIG. 1 and FIG. 2 and already partially described in German Offenlegungsschrift No. 31 43 208.5, there is manufactured from a thin metal foil 1, which can be coated on one or both sides with a suitable dielectric layer 2, a flat conductor path construction 5 which consists of two connected part constructions 3 and 4 (in the following referred to as sheets and represented in simplified sketches also as continuous sheets), and is fixed on a fastening or sealing layer 6 which is mounted on a strip-like carrier material 7.

High positional precision of the individual sheets relative to each other is achieved in that the conductor path construction 5, fixed on the endless carrier strip 7, is so folded longitudinally of a line of perforations 8 which is either manufactured without dimensional displacement, penetrating consecutively both the conductor path construction 5 and the carrier strip 7, or however is manufactured with sufficiently small dimensional displacement within predetermined limits, and penetrates only the carrier strip 7, that the dielectric layers are enclosed between the conductor paths of the folded-together construction. This perforation is thereby so formed that the longitudinal stiffness of the carrier strip material can be used to support a smoothly directed fold and—in so far as the conductor path construction is perforated—an electrically good and reliable conductive connection is retained through the perforated region of the conductor path construction.

Figure 2A:
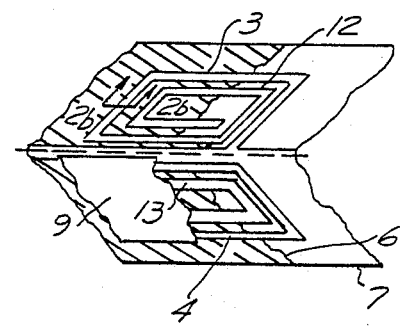
FIG. 2 shows a schematic representation for explanation of the folding process in constructions represented in FIG. 1 for the manufacture of identification arrangements.
FIG. 2B illustrates a cross-section view through a part of a conductor path illustrated in FIG. 2A.
Figure 2B:
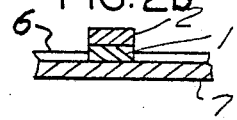

If for manufacture of the construction according to FIG. 1 a metal foil is used as starting material which is dielectrically coated on at least one side, the additional introduction of a dielectrically effective insulating layer 9 upon folding together is unnecessary. If in contrast a pure metal foil 1 without dielectric layer 2 is used as starting material, according to FIG. 2 a dielectrically effective insulating foil 9 must be introduced between two partial sheets.

Such an insulating foil 9 must also be introduced if such a conductor path construction 5 is manufactured by known etching methods on a carrier 7, which after the folding-together is to form the outer casing of the tag-like construction. In contrast, such an insulating foil can be omitted if such a conductor path construction 5 is manufactured by known etching methods on a dielectric foil 11, and the construction is on the contrary so folded together that the dielectric foil 11 is enclosed upon folding together between mutually overlapping conductor paths and thereby is effective as capacitor foil.

Figure 3:
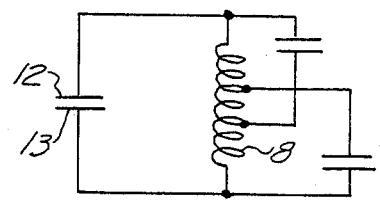
FIG. 3 shows an equivalent circuit diagram of the completed identification arrangements represented in FIG. 1 and FIG. 2.

In all cases there results a Thompson resonant circuit having a resonant circuit capacitance which is composed of a transformation of distributed conductor capacitances and of the concentrated capacitance between the conductor path parts 12 and 13. To a first approximation, the construction resulting after the folding process can be described by the equivalent circuit diagram in FIG. 3. Mutually corresponding parts and positions are designated there with the same reference symbols as in FIG. 1.

Figure 4:
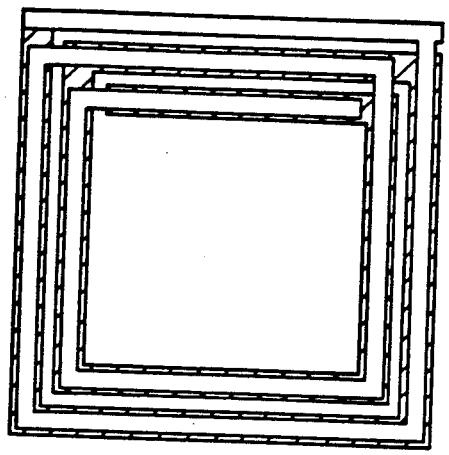
FIG. 4 shows a schematic representation of an embodiment of a conductor path construction for the manufacture of a tag-like identification arrangement according to the invention in which the entire resonant circuit capacitance is represented by the capacitive layers of strip line conductors.

In the embodiment illustrated in FIG. 1, the conductor path parts 12 formed in sheet 3 are narrower than the corresponding conductive path parts 13 formed in the sheet 4. Upon folding of the respective sheets 3 and 4, such result being shown in FIG. 4, the conductor path parts 13 (shown cross-hatched) superpose or overlap the corresponding conductor path parts 12. In this manner, the conductive path parts 12 and 13 can thus simultaneously form component parts of the coil winding to enable the greatest possible inductance with the smallest possible field distortion and eddy current loss. However, with sufficient overlapping surfaces of mutually superimposed conductor paths, the distributed capacitance formed can alone be sufficient to act as circuit capacitance so that in this case special capacitor surfaces can be completely omitted in such manner that the windings end within the layer structure in an open manner without termination such as illustrated in FIG. 4.

On the basis of FIG. 5 the essential features of an embodiment of the tag-like construction according to the invention will be described in which the conductor paths are located in various planes and cover opposite sides.

The point of departure for the invention of the described construction was the problem that in the manufacture of conductor paths on a plain metallic foil either by punching out or by etching out by means of simply and very quickly working etching methods, the spacing of the conductor paths, i.e. the mutually separating intermediate space, cannot be made arbitrarily small, and on the other hand however with geometrically small dimensioned resonant circuits of the described embodiment both in the case of stamping technology and in the case of fast etching technology, the still present requirement for safely controllable distances between the conductor paths claims too large a part of the entire available periphery, as a result of which the metal-free inner area of such a resonant circuit construction and as a result the resonant quality and the environmental field coupling, i.e. within such a detection system the sensitivity or field detectability of such a construction, are very strongly reduced.

Thus for example in practice a conductor path distance having favourable physical field properties in a tag measuring in periphery 40×40 mm is smaller that would be realisable by making use of stamping and fast etching technologies. Because of this, according to the invention, as is illustrated in FIG. 5, mutually superimposed conductor path sections are arranged having overlap which skips or alternates step-wise from plane to plane so that the intermediate space formed between the conductor paths becomes bigger than the thin contour spacing of the so-produced superimposed conductor path structure which remains after the folding together process.

The skipping or alternating overlap of conductor path parts from sheet to sheet is produced in that for example conductor path parts 20 and 21 of a sheet 18 overlap conductor path parts 30 and 29 of a sheet 19, i.e. the conductor path parts 20 and 21 are made wider than the conductor path parts 30 and 29. On the other hand, the conductor path parts 28 and 31 of the sheet 19 overlap conductor path parts 22 or as the case may be 23 of the sheet 18. In the same manner, conductor path parts 34 and 33 of the sheet 19 overlap conductor path parts 24 and 25 of the sheet 18. The conductor path part 26 of sheet 18 overlaps in contrast the conductor path part 32 of sheet 19 and the conductor path part 27 of the sheet 18 forming the capacitive surface overlaps the conductor path part 35 of the sheet 19 forming the other capacitive surface.

In a preferred embodiment of the invention, as a result, the overlap of the conductor path parts in the direction at right-angles to the fold-line or desired crease-line 8 is made more pronounced than in the direction parallel to the desired creasing line, so that specific positioning tolerances are allowed upon holding together—possibly by slightly inexact agreement of the creasing line on the carrier material and the intended desired creasing line on the conductor path structure which divides the two conductor path halves 36 and 37 longitudinally from each other—without noteworthy changing of the total effective circuit capacitance of the resonant construction.

Figure 5:
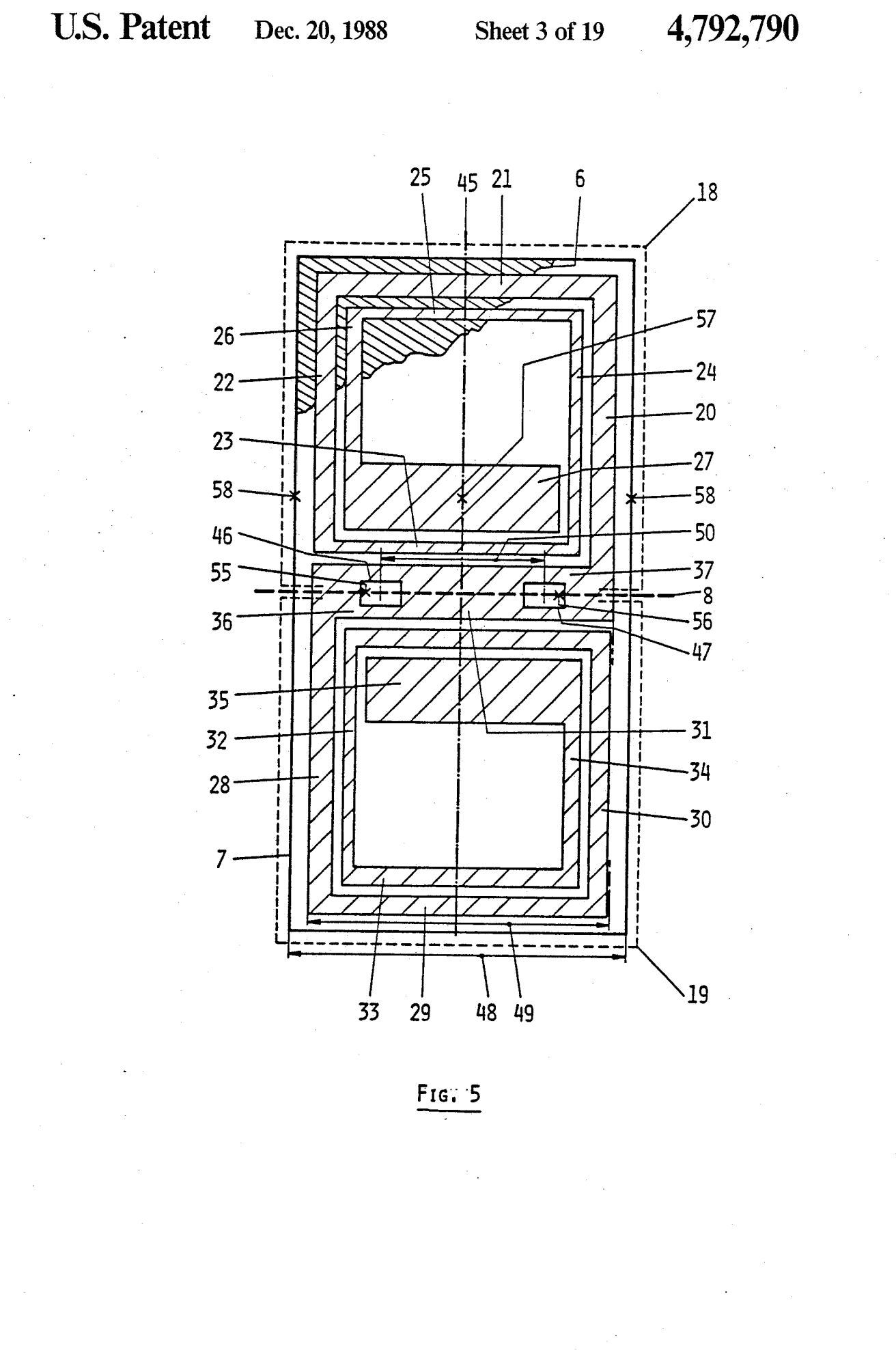

For explanation of the manufacture of a tag-like construction according to the invention, in the FIGS. 6 to 9 are represented as an example respective parts of a fixed sheet of a construction according to FIG. 5. Such a conductor path structure can be produced by suitable stamping or etching techniques.

Figure 6:
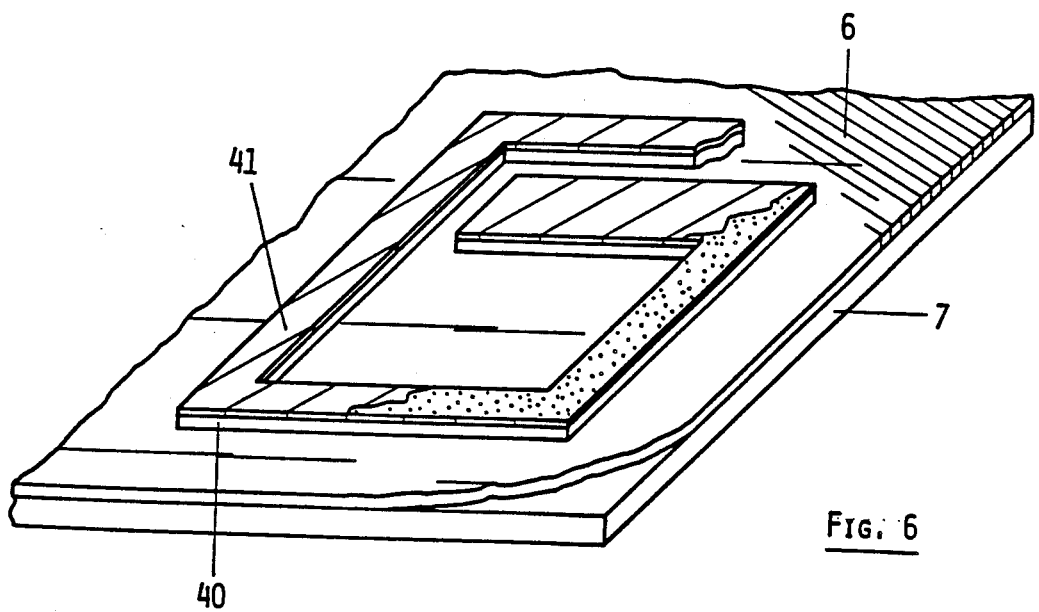
FIG. 6 shows a perspective view of a part of the tag-like construction according to FIG. 5 in the case where conductor path construction is cut out from a metal foil coated with a dielectric.

In use of a stamping method for the production of the conductor path structure, this can be cut out according to FIG. 6 for example from an at least two-layered foil-like material which consists of a highly conductive metal layer 40—preferably of aluminium or copper—and a layer 41 provided thereon in a suitable manner and having suitable dielectric properties, so that this dielectric coating of the conductor paths mutually insulates, after the folding together process, all conductor paths of the various sheets in the manner of a selectively distributed dielectric and holds them at a definite spacing from one another. The side of the stamping yield which is averted from the layer effective as the dielectric thereby adheres directly to a sealing layer 6 with which a suitable carrier material 7 has been equipped before mounting the structure thereon.

Figure 7:
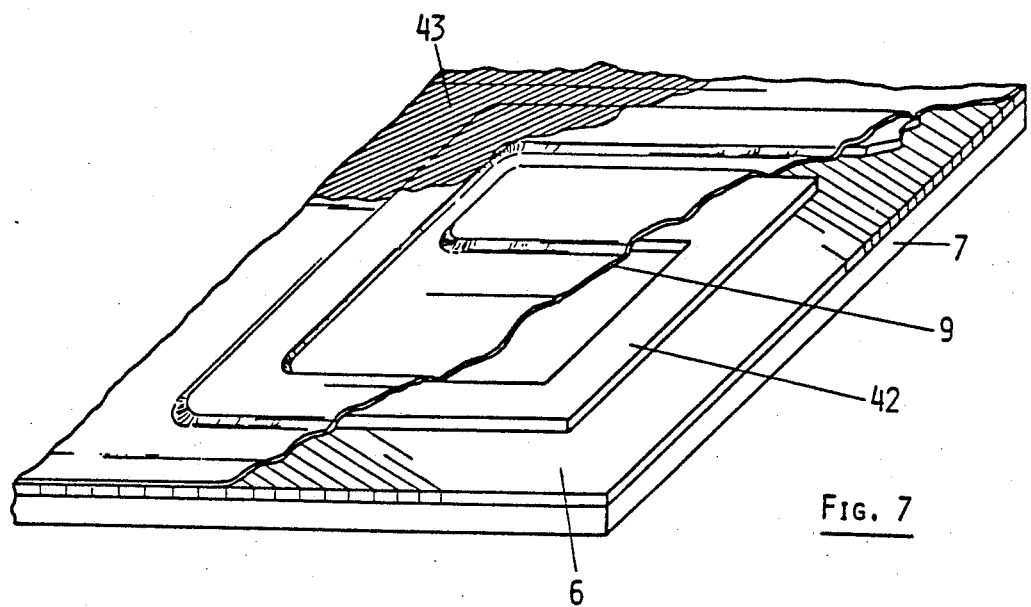
FIG. 7 shows a perspective view of a part of the tag-like construction according to FIG. 5 in the case where the conductor path construction is cut out from a pure metal foil.

Under certain conditions, it can also be advantageous to stamp out the conductor path structure according to FIG. 7 from a pure metal foil 42 so that after fixing of the stamping yield on a sealing layer 6, with which a suitable carrier material 7 has previously been equipped, a dielectric foil 9 introduced before folding together ensures an insulating separation of all conductor paths of the various sheets at a definite spacing.

Figure 8:
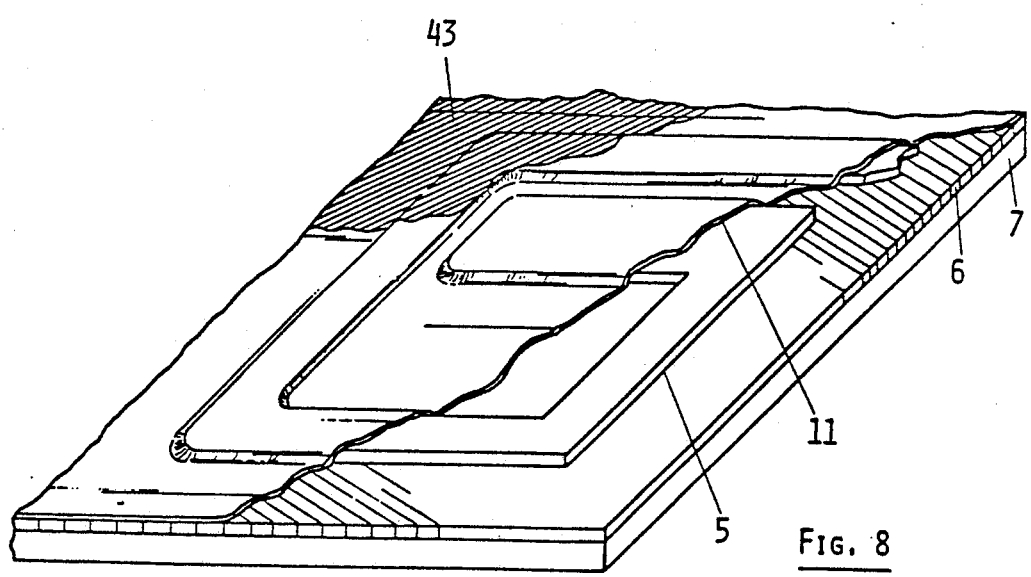
FIG. 8 shows a perspective view of a part of the tag-like construction according to FIG. 5 in the case where the conductor path construction is etched out from a metal foil coated with the dielectric.

According to FIG. 8, in a similar way a structure according to FIG. 5 or an analogous structure can be manufactured by etching of the conductor paths from a dielectrically coated metal foil so that after the manufacture of the flat conductor path construction 5 this can be first of all transported and positioned by means of a connected continuous dielectric carrier layer 11, so that the etched out conductor paths 5, and also all non-metallized zones of the dielectric layer 11, first adhere to the sealing layer 6, and secondly the remaining dielectric layer 11 hereafter fulfills in the same way the function of an introduced insulating foil or of a stamped-out dielectric coating on stamped-out conductor paths.

Figure 9:
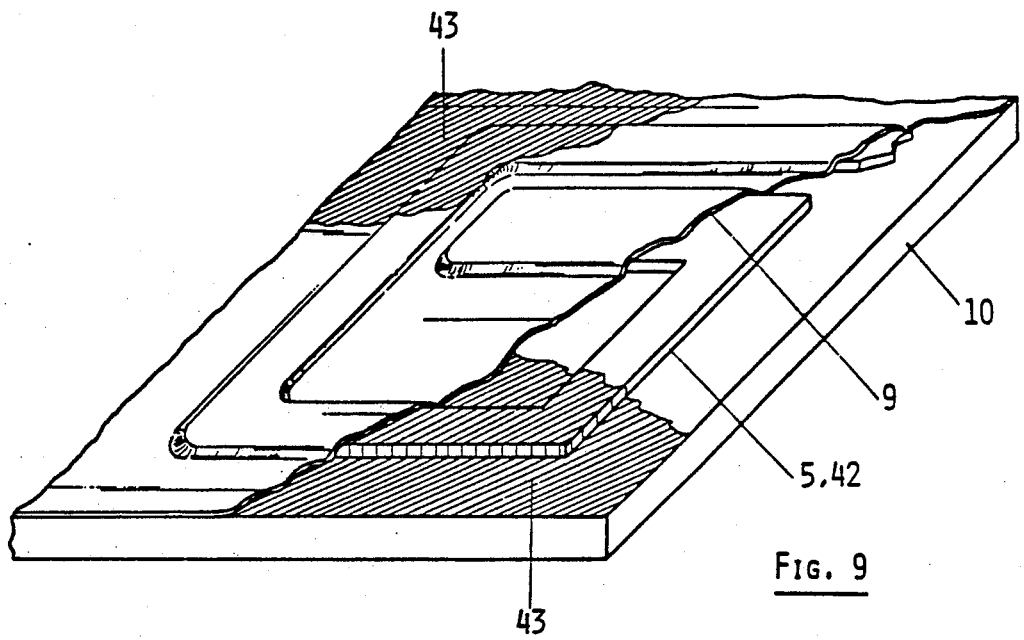
FIG. 9 shows a perspective view of a part of the tag-like construction according to FIG. 5 in the case where the conductor path construction is etched out of a metal foil connected to a working carrier.

If a dielectric layer on the other hand results which is too thin to allow the transport and sufficiently exact positioning of a conductor path construction formed thereon by etching—perhaps upon the need to realise larger capacitance on smaller surfaces—then according to FIG. 9 a structure according to FIG. 5 or the like can be produced also by etching of the conductor paths from a metal foil 42 which is covered with an etch-resistant carrier material 10 which is suitable also as casing material for the finished arrangement. Also in this case—perhaps after necessary removal of an etch-resist—exactly as in the manufacture by stamping from a pure metal foil, an insulating dielectrically effective foil 9, which holds all conductor paths of the various layers at a definite spacing, must be introduced between the sheets before the folding-together process.

The folding-together of the construction according to FIG. 5 or the like takes place preferably in that many such constructions are mounted at a suitable spacing endlessly in succession onto a strip-like endless carrier material 7 and this strip moved in a creasing guide is folded together along a perforation line or fold-line 8, which line 8 is either formed, with penetrating the carrier strip, before the provision with conductor path structure in defined dimensional relationship for positioning of the same, or is formed, with penetrating both the conductor path structures and the carrier strip, directly upon or after the provision with conductor path structures 5.

Sufficient adhesion of the dielectric layers on each other or of the metallic surfaces of conductor paths on inserted dielectric layers can, according to FIG. 1 and FIG. 6 to FIG. 9, be achieved by a suitable, very thinly applied fastening adhesive 43. Under certain conditions, such an adhesive can be also omitted where the folded-together structure is sealed completely flat by means of the activatable sealing layer 6, if the conductor path structure is manufactured by stamping (cf. FIG. 6). Finally, also chemical activation of the dielectric surfaces—perhaps to be maintained temporarily only during the folding-together process can be used in order to achieve a sufficient adhesion either of the dielectric surfaces on each other or also of the metallic surfaces on the dielectric surfaces.

In particular, if the conductor path construction is stamped out from a metal foil which is dielectrically coated or uncoated and thereafter is to be fixed by adhesion on the sealing layer 6 of the carrying material 7, i.e. the resonant structure resulting after the folding-together process is to be sealed on all sides directly or indirectly by the sealing layer 6, both symmetrically and longitudinally of the intended desired folding line and also preferably symmetrically to the longitudinal axis 45 of the conductor path structure, openings 46 and 47 can be stamped in the conductor path structure as is illustrated in FIG. 5.

This breaking-through of the metal foil strip can advantageously result even before the actual conductor path structure is stamped out of it. Also, the manufacture of these penetration points can be connected with a process of dimensional clipping of the metal foil, or, as the case may be, the splitting, of a wider foil strip into narrower partial strips, such as are necessary for the manufacture of the flat conductor path construction.

With tag-like constructions, which contain conductor paths superimposed on each other longitudinally of peripheral edges, it has proved advantageous to make the length 48 of such constructions slightly larger than the overall contour dimension 49 of the folded-together conductor path construction, so that this can be sealed together adhesively even at the outermost edge of such a tag-like construction and that upon subsequent separation of the finished strip into individual tags no short-circuits can be caused between conductor paths of the various layers. In this particular case and also if such conductor path constructions are manufactured and positioned individually, i.e. if the individual conductor path constructions are not manufactured connected each with another by a through-going conductor strip longitudinally of the desired fold-line 8, it has proved advantageous to provide two such, penetration openings 46, 47 which also can be arranged square or round. However in other cases, also one individual suitably dimensioned penetration oriented longitudinally of the desired fold-line can be provided, which penetration can also be arranged unsymmetrically to the longitudinal axis of a corresponding conductor path construction and under certain conditions performs the same as two or even more such penetrations.

In the case of two such penetrations 46 and 47, it is further advantageous if these have in the direction of the desired fold-line a spacing 50 which corresponds to half the length 48 of a finished arrangement. In principle however this spacing 50 can also include any whole-numbered fraction of the length.

The following advantages are achieved by openings executed this way;

The foil strip which is still unprocessed apart from having been already clipped to processing width is delivered to the stamping station with constant feed rate by means of known film grippers which engage in the openings 46 and 47 and transport the strip forwards into the stamping mechanism in each case at a half or whole length 48 in one or preferably in two steps.

Upon folding together and sealing of the manufacturing-carrier strip with use of selectively activatable sealing properties of the sealing layer 6, this sealing layer is in mutual sealing contact not only on the peripheral regions outside the folded-together conductor path structure and within the boundary line 48, but also within the folded openings 46 and 47. By this, bulging open of the zone which includes the conductor path halves 36 and 37 is effectively prevented, and this applies particularly if the finished strip construction is to be separated into individual tags and rolled up on a separating paper strip.

In the case of arching, shear strains appearing along the perforation zone within the multilayered arrangement are effectively divided and diverted by means of this punctiform fastening so that no creasing can occur along the perforation edge. This provision is particularly advantageous if the conductor paths of various sheet according to FIG. 6 or FIG. 7 are fixed and positioned on each other without use of a fixing adhesive 43, i.e. a largely constant spacing geometry may be achieved and ensured exclusively by sealing of the folded-together conductor path construction.

Figure 10:
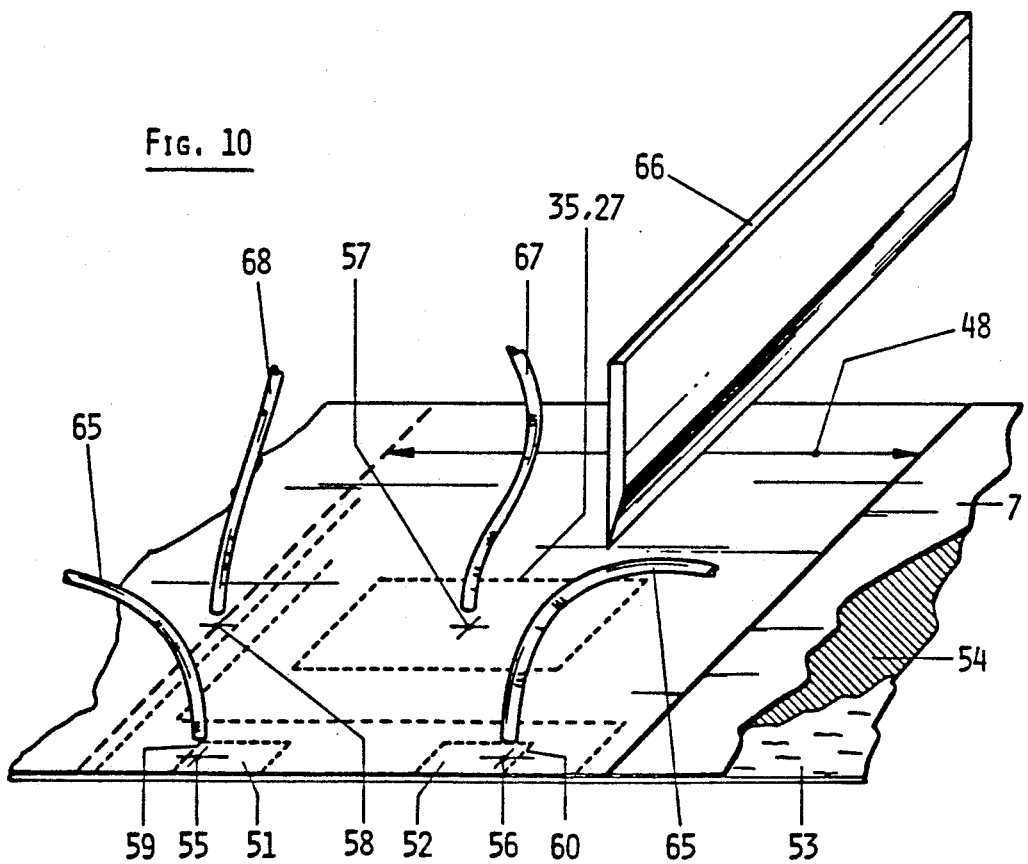
FIG. 10 shows a schematic representation for explanation of the positioning process of finished tag-like constructions arranged in an uninterrupted series for separation of the endless production strip into individual tag-like identification arrangements according to the invention.

Further advantages of these openings 46 and 47 can result if a light-transparent material is used as carrier material 7 and thereby as casing material of the finished arrangement. As can be seen from FIG. 10, marginal cutouts 51 and 52 resulting from these openings after the folding-together process and the contour of the resonant arrangement visible in the incoming light are used in order to achieve a precise positioning of the folded-together finished strip construction for separation into individual tags. By this means in particular, advantage can be taken of the diffusion properties of the casing material 7 and of an adhesive layer 54 if necessary covered with a separating paper 53, as well as brightness integrating properties of unaligned glass fibers as light receivers and transmitters.

For this purpose, the outwardly pointing edges of the so-formed cut-outs 51 and 52 on the points 55 and 56 as well as the presence of the capacitor, consisting of mutually overlapping layers 27 and 35 on the point 57 or the absence of the capacitor on the points 58 are monitored by means of light-barriers. At a positioning in which the outer edges 59 and 60 of the openings 46 and 47, which function as slidable shutters, and therewith the cut-outs 51 and 52 allow the same amount of light to pass in the receiving glass-fibers 65, the finished strip construction is secured by holders and separated in each case between two neighbouring outlines, in so far as simultaneously the receiving fiber 67 receives no light from point 57 or the receiving fiber 68 receives light from point 58. Then and only then is the finished strip construction correctly positioned length-wise on a separating knife 66.

Figure 11:
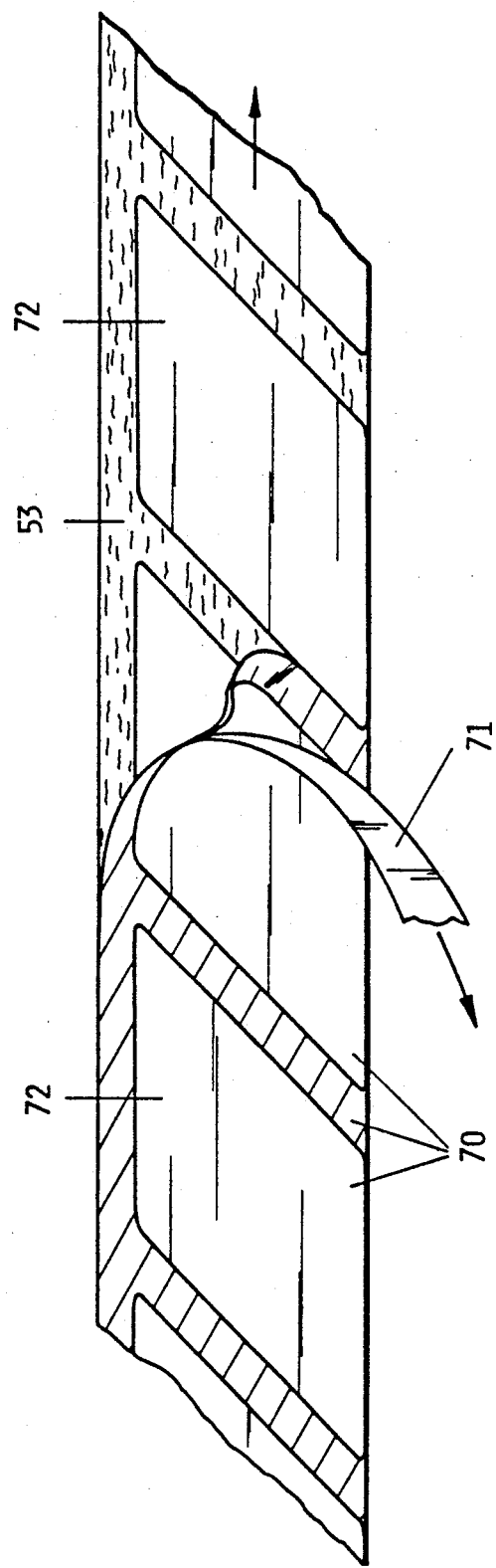
FIG. 11 shows a schematic representation for explanation of the separation of individual tag-like identification arrangements from the endless production strip, wherein the tags which are made self-adhesive for particularly simple processing by means of automatic unrolling dispensing apparatus can be rolled up with a separating paper strip.

In this way it is possible to separate the finished ribbon-shaped strip construction very exactly and quickly without waste and intermediate grid space, preferably on a covering separation paper 53, into individual tags of length 48 in such manner that these hereafter can be self-adhesively dispensed by means of automatic rolling tools. In an analagous way, with a suitable arrangement of such light barriers and suitable selection of control points 55, 56, 57 and 58 and a suitable arrangement of penetration points 46 and 47 it is also possible to separate, in spaces on a readily processed strip 70, tag-like constructions manufactured not directly adjacent each other on a processing carrier, so that the tags 72, after removal of outer lattice waste 71 after the separating stamping process are placed at intervals insulated individually from one another on a separating paper so that they can be rolled up, see in this connection FIG. 11. In particular, this applies also to the manufacture of circular-shaped tags and tags having a plurality of label fields—if necessary mutually separable—of which only one or at least not all are secured by an internally buried resonant arrangement, and the majority not fitted with self-adhesive layer can be processed from the roll in such manner that no separating cut but a suitable separating perforation is used for simple subsequent manual or machined separation of individual tags.

This method of positioning based on analagous comparison of two luminous densities operates—with blank carrier material—so exactly that error-free separation of such arrangements to produce finished tags is even possible if without metal-free safety boundary the largest dimension 49 of the viewing outline of the conductor path construction measures identically with the whole length 48 of a finished label, i.e. the conductor path constructions are fixed with the smallest possible spacing from one another on the carrier material strip.

In a wholly similar way, the openings 46 and 47 can be used as positioning apertures if the carrier material strip 7 should be brought into a definite position for the purpose of the application of stamped-out conductor path constructions 5 thereon, so that all conductor path constructions repeat thereon always exactly at the spacing 48 on the manufacturing carrier strip or carrier material strip to be processed.

The manufacturing costs of such resonant elements are extensively influenced by how long such a construction is on average processed in a production machine, i.e. which average manufacturing time this claims. For the highest manufacturing speeds it is therefore logical to carry out the manufacture in several parallel processing tracks. This is—even track-synchronously—possible, in that for example a plurality of manufacturing carriers are tailored from a wide path which then preferably synchronously—are equipped with conductor path constructions by possibly multiple parallel stamping mechanisms. It is however also possible by means of a central high-speed stamping station to "stack" the corresponding conductor path constructions in matrix-like stores. Proceeding from here, they can be distributed by means of a suitable transfer arrangement for fixing on the manufacturing carrier strips.

Experience has shown that with highest manufacturing speeds it is not the stamping-out of the conductor path outline as such but much more the sufficiently exact positioning in respect of a desired fold-line on the carrier path which limits the manufacturing speed, i.e. which leads to a "speed bottle-neck" of the manufacturing process. Errors during positioning occur particularly when multiple parallel manufacturing tracks—fed from a plurality of individual respectively assigned stamping mechanisms—are synchronously operated and a correction operation on one track during the time of its execution can thus stop or block the remaining tracks.

It is true that the skipping overlappings of the conductor paths are in principle so constructable that they can compensate for even larger positioning and folding tolerances of the conductor path construction without erroneous changing of the circuit frequency and the circuit inductance. This does not apply however to the achievable resonance Q factor of such constructions and this is for the following reasons. Due to the continuous capacitive layers of mutually superimposed conductor paths the currents flowing through the various conductor path parts are not equal. Thus, in FIG. 5 the biggest current flows in the two mutually connected conductor path halves 36 and 37, the smallest in the conductor paths 26 and 34 which terminate into the capacitive layers 27 and 35. For this reason, the magnetic fields are not fully compensated between radially neighbouring conductor paths in the plane of the dielectrically effective layer, as is for example the case with a low capacitance simple plane spiral coil. Resulting magnetic rest fields can not now however surround respective superimposed conductor pairs on the shortest route, since they impinge on the overlapping conductor edges. In part the magnetic rest fields are shunted and in part they are urged into the overlapping edges and produce there eddy current losses which precipitate a resonant loading of the resonant circuit and thereby deterioration of the Q-factor.

From this there results the requirement that in the interest of a Q-factor as large as possible the overlapping coverings should not be made arbitrarily large, only to permit sufficient folding tolerances.

Figure 12:
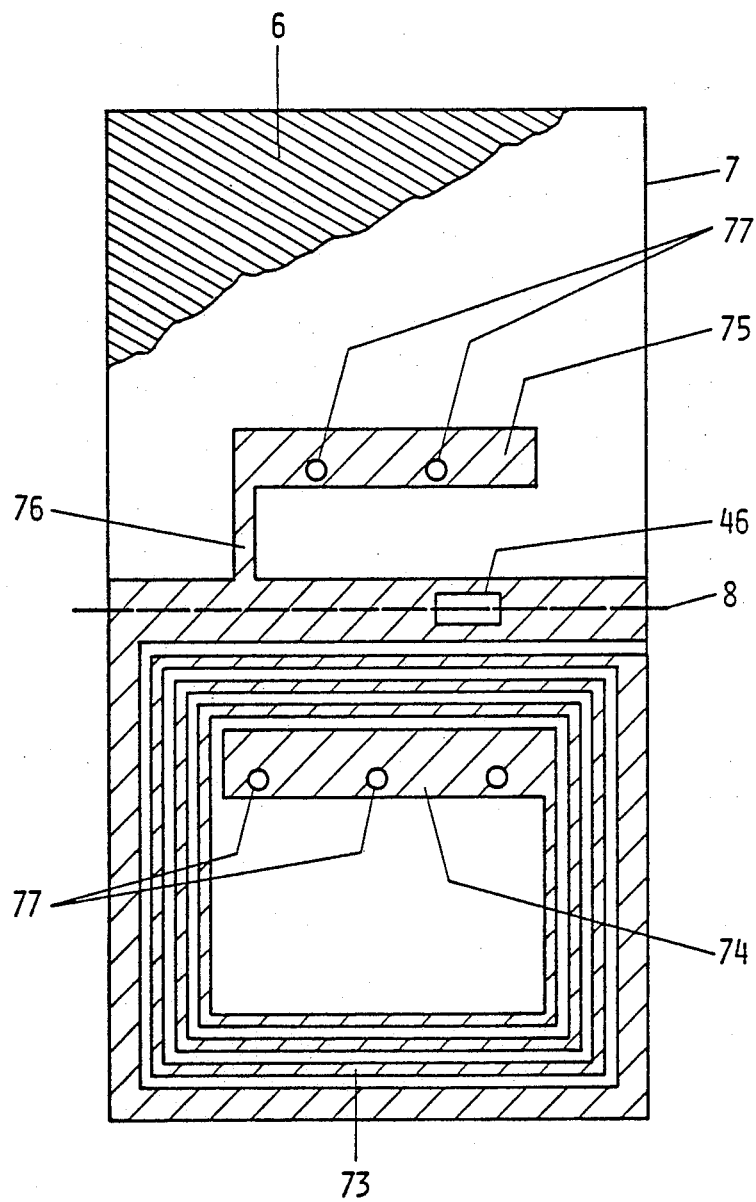
FIG. 12 shows a schematic representation of a further embodiment of the tag-like construction according to the invention.
Figure 13:
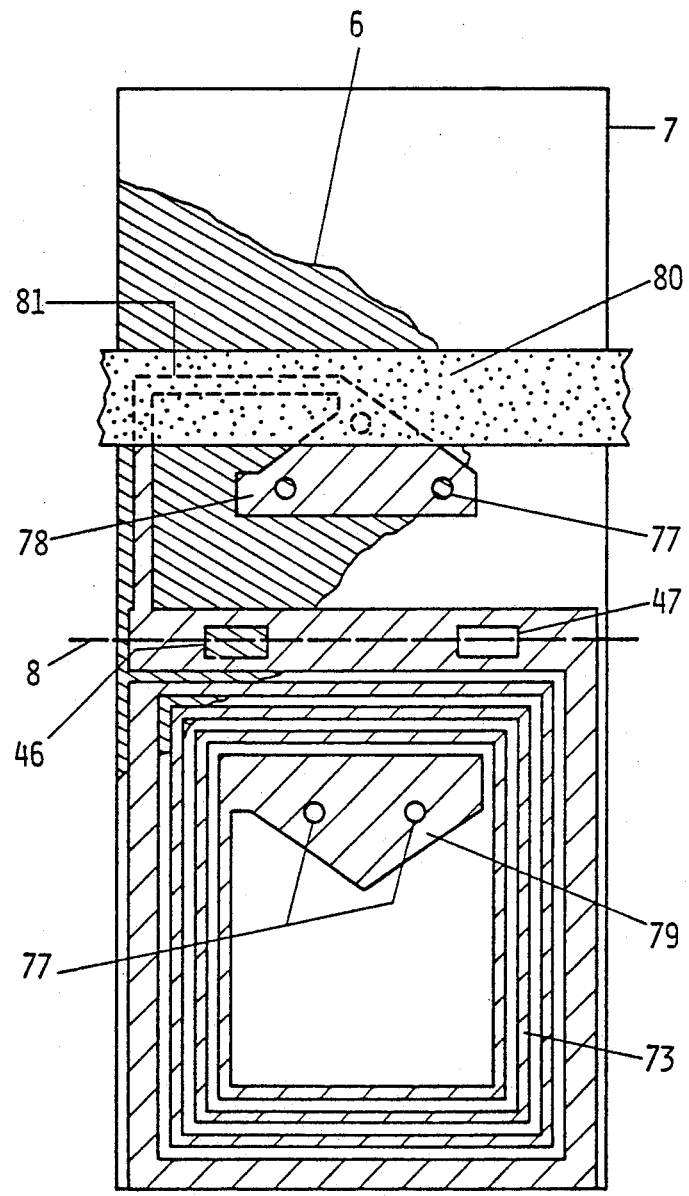
FIG. 13 shows a representation of a particular embodiment of the tag-like construction according to the invention according to FIG. 12, which allows the adjustment of the resonant frequency of the identification arrangement to be finished.

As may be seen from FIGS. 12 and 13, for this reason for the manufacture of larger quantities per time unit and thereby simultaneously to reduce requirements in respect of the positioning accuracy upon folding-together of the conductor path construction together with the manufacturing carrier strip, it can be useful to abandon the principle of the oppositely sited covering conductor paths and—for the purpose of ensuring a Q-factor of constant magnitude—instead of this, still adhering to the principle of the manufacture of a plane conductor path construction which is folded along a desired fold-line 8 to produce a three-dimensional resonant construction, to realize in one sheet plane mainly the inductive part 73 of the resonant construction with the capacitive part 74 and in the other sheet plane the still necessary capacitive part 75 and its necessary connection 76 with the inductive part 73.

A flat spirally-arranged conductor path structure may be considered as the inductive construction. In all parts of the conductor path construction producing the inductance such a construction leads to almost equal currents so that eddy current losses have a less decisive significance in the region of the windings but however a larger significance in the region of the capacitor surfaces which are made larger in order to have a sufficient total capacitance. Normally it is in such a configuration useful to employ smaller eddy current losses, i.e. a high Q-factor by means of a high inductance and a correspondingly low circuit capacitance or however by means of a particularly thin dielectric, which enables a larger circuit capacitance even with small aerial capacitor layers.

With such an embodiment, the advantage can be used that solely within a limited planar one-pieced and narrowly bounded region a sufficiently exact covering has to be achieved during the folding-together process of the plane conductor path construction, that is to say in the region of the oppositely sited covering capacitor layers 74 and 75. By correspondingly selected peripheral overlapping covering, by this means greater positional tolerances can be relatively easily handled, i.e. less exact and quicker positioning methods can be used with smaller expenditure on control.

Both in the manufacture of the flat conductor path construction from a dielectrically coated metal foil by stamping and in the manufacture by other methods, in particular however in the manufacture by means of known etching techniques from such a foil, it has proved useful, according to FIG. 12 preferably to provide a few staggered penetration points 77 in the capacitively effective layers 74 and 75. In this case, by means of alternating penetration of the sealing layer 6 through these penetration points 77 to each layer after next, thus to the surface belonging to the oppositely lying sheet, a dimensional sufficiently stable, even if only punctiform, fixing, which in its effect is practically in each case sufficiently invariant in respect of the capacitance, of mutually superimposing capacitor layers can be achieved even with rolling-up requirements of such an arrangement, in particular even if moreover no further measures are taken for the adherance of dielectric surfaces on each other.

As was already described in German Offenlegungsschrift No. 31 43 208.5, it is also possible in the embodiment represented in FIG. 13 to introduce between the two mutually superimposed conductor path parts 78 and 79, which form a capacitive element, a dielectric adjusting element 80 whose position in respect of the conductor path parts is adjustable. As a result, the dielectric adjusting element 80 cooperates with the capacitively adjusting surfaces formed by the conductor path parts 78 and 79, whose shape as regards the adjustment direction of the dielectric adjusting element can be so designed that by shifting of the same in the adjustment direction between two mutually superimposed adjustment surfaces the adjustment capacitance formed by this and by the dielectric adjusting element changes according to a desired function versus the shifting amplitude.

The same method is of course usable also in the embodiment according to FIG. 5.

The form of a conductor path construction such as is illustrated in FIG. 13 enables the double-use of a dielectric adjusting tape 80, which is endlessly and track-variably laminated into the strip-like manufactured construction, in so far as this adjusting tape in each possible adjusting position in addition reliably separates the conductor paths of the one sheet forming the inductive elements 73 from the conductor path piece 81 connecting the inductive element with the capacitor layer 78 of the other sheet. Such an additional insulation of mutually crossing conductor paths from each other can be advantageous if such tags are to be provided before use for example with a deeply impressed needle printing. The conductor path construction can also be arranged in a way that not only a part but all cross-overs of the conductor paths can be additionally insulated from one another by an adjusting tape.

Figure 17:
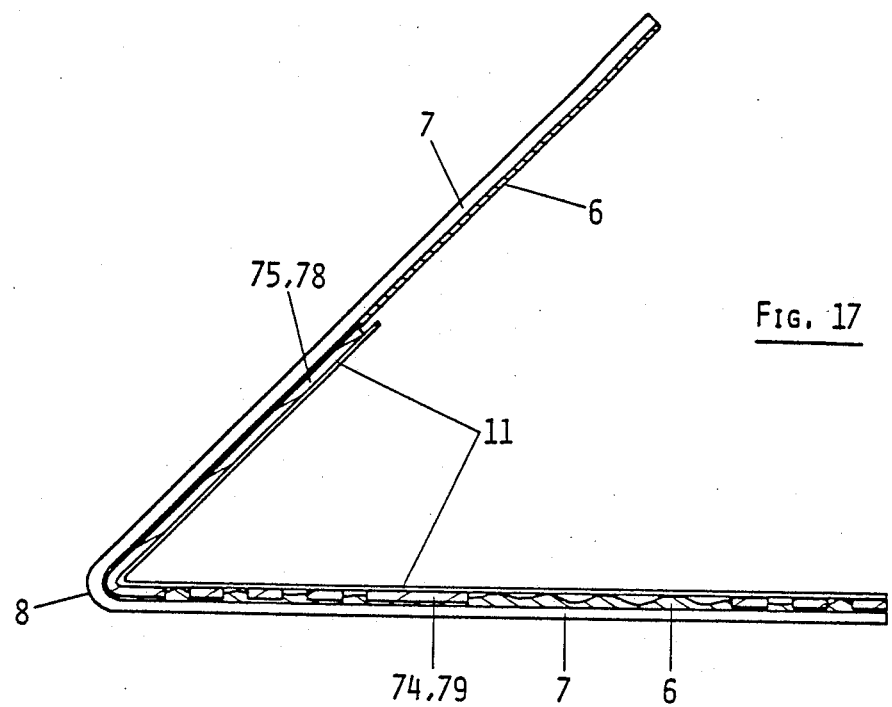
FIG. 17 shows a schematic representation of a cross-section through a tag-like construction according to FIG. 12 having parts folded together, where the necessary conductor path construction is etched out from a metal foil coated with a dielectric.

. In the case of the manufacture of the flat conductor path structure by known etching methods, not only from the view point of cost and material savings but also from the view point of an as simple as possible final sealing of the folded-together resonant construction it can be useful to provide that the foil strip which serves as a starting material is in total only as wide as is absolutely necessary for the manufacture of the conductor path construction. This will be described in more detail on the basis of FIG. 17 and 18. In this case, the throughgoing foil layer in one sheet is sufficient only up to the boundary contour of the capacitor layer 75, 78. Sufficient geometrical fixing of the conductor layers with respect to each other results in connection with the sealing layer 6 from the previously mentioned staggered penetration points 77 together with the layer dielectrically separating the capacitor layers 74 and 75 or as the case may be 79 and 78. Particular measures to ensure connection of the casing 7 of the arrangement on the side of the resonant arrangement averted from the desired folding line 8 and the capacitor are then unnecessary since although the sealing layer 6 of the processing carrier 7 then mutually adheres indirectly there, it, however adheres directly by double-sided adhesion on the foil-like insulating layer 11 of the starting material, the whole surface of which layer remains after the etching and which is used as dielectric of the capacitor in double thickness by folding. See FIG. 17 in this connection.

Figure 18:
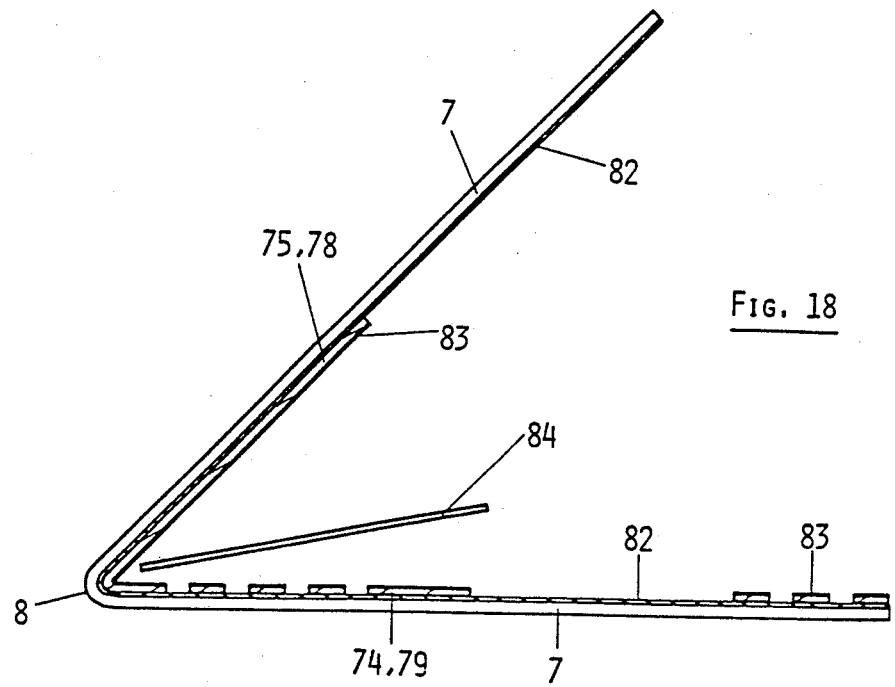
FIG. 18 shows a schematic representation of a cross-section through a tag-like construction according to FIG. 12 having parts folded together where the necessary path construction is etched out from a metal foil connected to a covering material suitable as working carrier.

In an analogous manner it is also possible to etch out the flat conductor path structure from a metal foil which—by means of a suitable laminator 82 is lined on the carrier or casing material 7, as long as an etch-resistant, washable, or cleansible material is selected for this. If in this connection an etch-resistant dense self-sealing layer is used as laminator, which is substantially not degraded by the etching medium in its adhesive power, and the metal foil is sealed from the back without gaps, the manufacturing process becomes further simplified in that before the folding-together process of the washed and dried carrier or casing strip and—where necessary—after removal of an etch-resistant covering 83, a capacitor foil 84 of defined property can be introduced only in the region between the desired fold-line 8 and the outermost edge of the capacitor construction. Also in a construction such as illustrated in FIG. 18, the method of fine adjustment for compensation of frequency offsets due to oscillations of various process parameters and material properties is just as applicable as is the method for edge sealing of the perforated marginal zones and optoelectronically controlled positioning for separation. According to FIG. 18, analogously to FIG. 7, the limitation to only a relatively narrow capacitor foil 84 as dielectric 9 is possible if the conductor path construction is stamped out of a pure metal foil and is designed in a way that the capacitor foil separates at least conductor path sections which are capacitively effective or cross each other in different planes.

In FIG. 13, two suitable openings 46 and 47 in the center part of the conductor path construction are illustrated for transport, for edge-sealing and for positioning of the foil strip or of the readily processed strip manufacturing containing the conductor path construction.

Since—preferably in the case of manufacture of the conductor path construction from a dielectrically coated metal foil by stamping—this type of arrangement according to the invention contains longitudinally of the peripheral edges conductor paths mutually superimposed only upon one side, which however are held together by the lined up perforation webs of the casing material, the conductor path construction can be so arranged that the outermost winding of the inductive construction quite extends to the cutting region of the periphery contour, i.e. such a tag can have a surrounding "metallic reinforced border", since the sealing layer adheres on both sides of the conductor path representing the outermost winding of the inductive construction and the casing material is indirectly connected together with the interposition of just this conductor path.

This property of such an embodiment of the arrangement according to the invention thereby advantageously features the coupling of an as large as possible magnetic flux at least within the outermost winding of the resonant circuit, since the omission of a particular sealing zone outside the peripheral contour of the folded-together conductor path construction permits a good use of the peripheral dimensions of the finished arrangement.

The omission of such a surrounding sealing region permits the manufacture of the conductor path construction also in a way that the conductor strip portion including the desired fold-line is formed as a throughgoing strip which endlessly connects all neighbouring sequential conductor path constructions and which can simplify the precisely dimensioned spacing positioning of the conductor path construction on the manufacturing carrier strip. Since in this case in the border region between two sequentially following conductor path constructions the transmitting light barriers interrogating this conductor path remain interrupted, a substantially simplified optical interrogation for the determination of the separation positioning can take place even by means of on opening 46 in each conductor path construction, the two bordering edges of such an opening which lie opposite one another both in the direction of the perforation line then functioning as apertures to be aligned before cutting.

Figure 19:
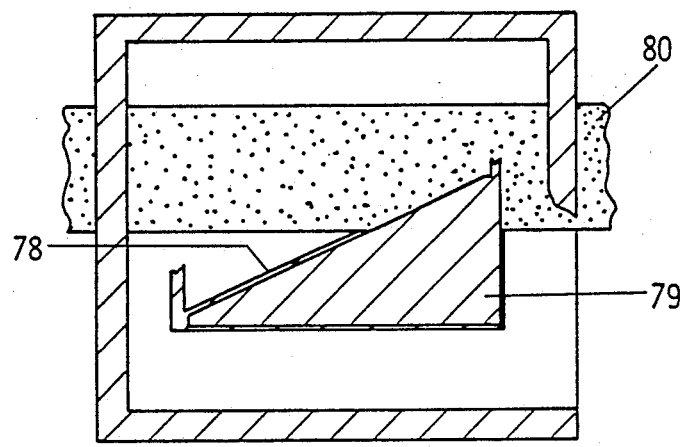
FIG. 19 shows a schematic representation of the tuning of the resonant frequency within particularly wide limits in particular in the rectangular embodiments of the invention.

Thin tag-like constructions with a resonant frequency which is settable or tunable continuously within wide boundaries can be manufactured if an embodiment according to FIG. 19 is selected and the tuning strip 80 is formed with low dielectric constant and sufficiently thick, and the capacitor surfaces 78 and 79 have an outline which produces a particularly wide change of the effective capacitance upon track displacement of the tuning strip 80.

Figure 14:
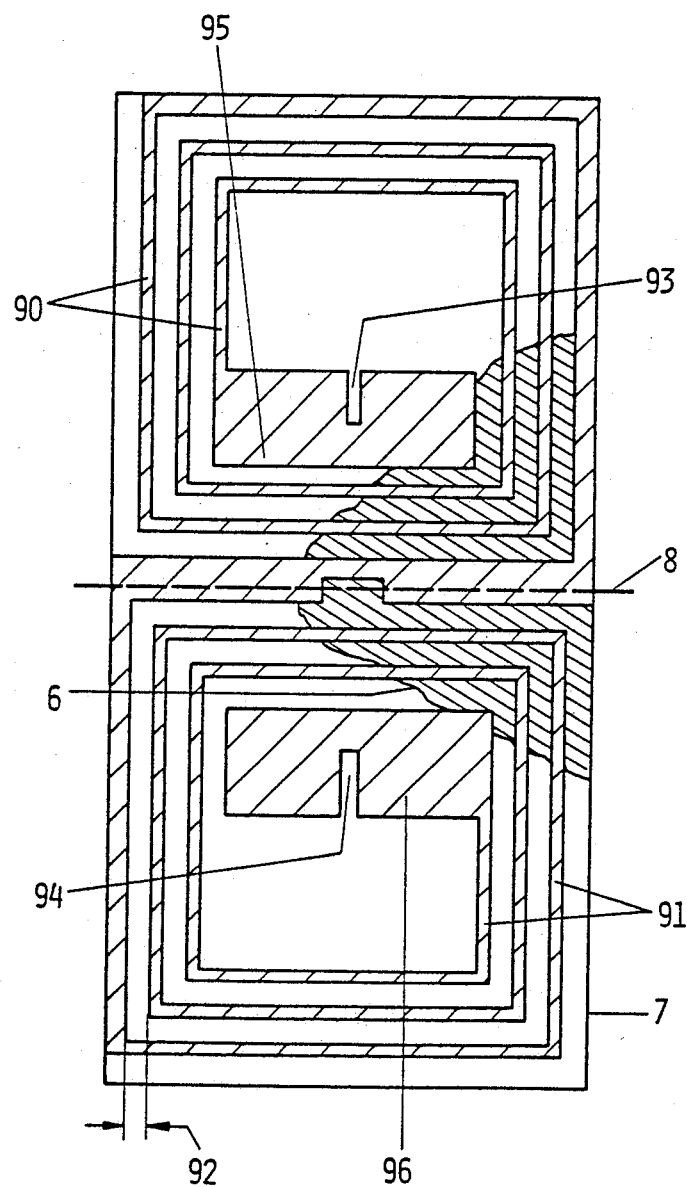
FIG. 14 shows a schematic representation of a further embodiment of the tag-like construction according to the invention having conductor paths which are arranged at intervals and which extend substantially rectangularly.

FIG. 14 shows a schematic representation of a further embodiment of the invention in which the conductor paths forming the inductive element are alternatingly enclosed within each other spirally after folding together. In this way the "winding" of the inductive element is distributed into two planes. The windings 90 of the one side or of the one sheet fall however upon folding-together in the intermediate spaces of the windings 91 on the other sheet.

As a result a conductor path construction results which particularly with the use of rotative stamping techniques can be easily separated into stamping yield and stamping waste. An important property also of this embodiment consists in that the metallization from one to any next yielded stamping production may be designed continuously uninterrupted, i.e. a one-piece "product band" or useful band made up by connected stamping yields can be manufactured since the outermost windings of the inductive element are separated from those of the neighbouring tag at the end by separating or dividing the readily manufactured strip into individual tags The most important advantages of this embodiment are the following. The spacing 92 to be handled with stamping techniques between the individual conductor paths appears still essentially uncritical, i.e. larger than with the above described method of the incrementing superimposition of conductor paths step-wise by skipping from sheet to sheet. The spacing between the interfolded conductor paths can (almost) be made arbitrarily small and the lower limit is determined only by the precision during the folding process.

The above described eddy current problems in the region of the superimposed conductor paths are almost completely absent in this embodiment so that a high Q-factor is readily attainable. The slits 93 and 94 of the capacitively effective conductor path parts 95 and 96 which are visible in FIG. 14 achieve in addition an advantageous reduction of the eddy current loading.

Contrary to the embodiment with overlapping and superimposed conductor paths, the sealing is simplified at least to the same extent as in the above-described "separated one-sided" realization of inductance and capacitance, since only in the region of conductor path parts reacting capacitively one with another two dielectric surfaces must be made to adhere together on the remaining region of the structure—except insignificant cross-overs of conductor paths—in each case the conductor path construction when folded together is adhered on both sides by means of the sealing layer 6 into the casing material 7. Since this applies in particular to the conductor paths on the border, the tag border can be made "metallized", i.e. the outermost conductor path parts can border the marginal cuts of the tag so that the outermost winding can be made as wide as possible and by this the entirely realisable effective magnetic flux area of such a tag can be used to the maximum extent without any need of wasted area by excessive casing material only for the purpose of marginal sealing to the respective other side.

With reference to simplified ways of optoelectronically controlling the positioning for separating of finished tags from the folded and sealed manufactured strip the same applies as already explained in respect of the embodiment having an inductance completely made on one of the two sheets.

Moreover FIG. 14 shows slits 93 and 94 in the capacitively effective conductor path parts 95 and 96 which in the same way may be used for positioning of the sealed manufactured strip by (means of) monitoring suitable light barriers.

Also this embodiment permits the unlimited use of the already described manufacturing techniques which employ blank or dielectrically coated or even etch-resistant coated metal foils as starting materials.

Figure 15:
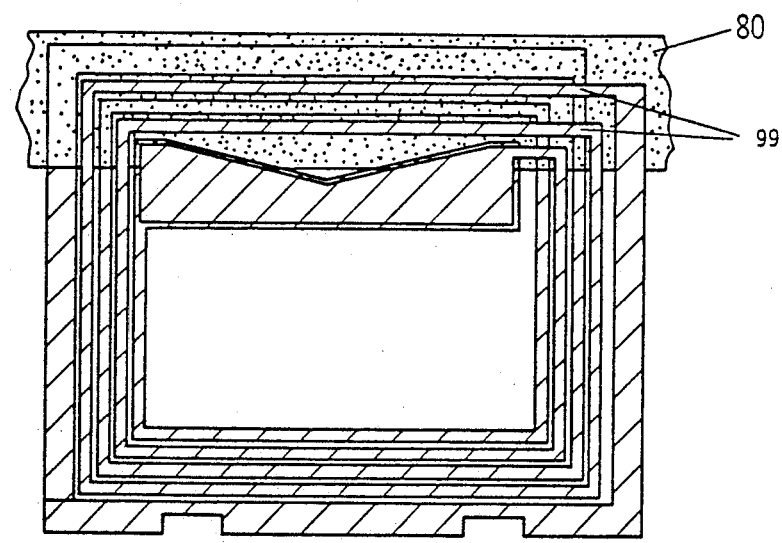
FIG. 15 shows a schematic representation of a particular embodiment of the tag-like construction according to the invention and according to FIG. 14, which allows adjustment of the resonant frequency of the identification arrangement to be finished and offers an increased insulation of the mutually crossing conductor paths without additional expenditure.
Figure 16:
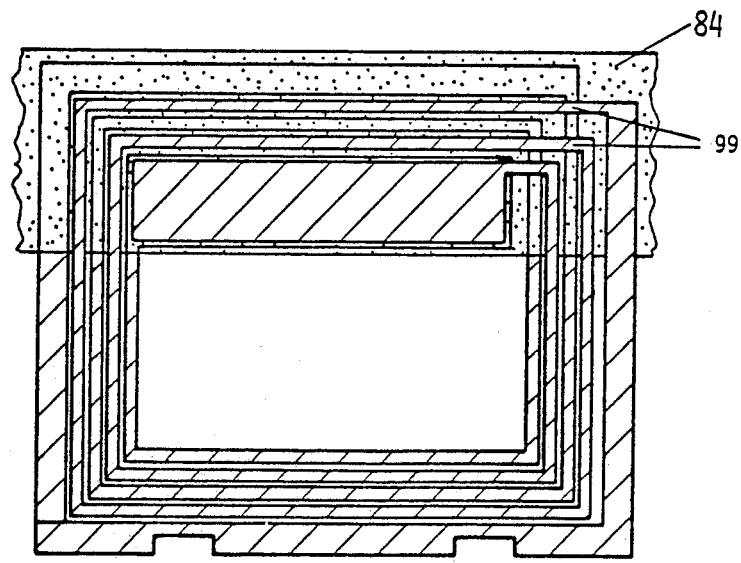
FIG. 16 shows a schematic representation of a particular embodiment of the tag-like construction according to the invention and according to FIG. 14 which permits manufacture with minimal material cost expenditure.

FIG. 15 shows for example a folded conductor path construction of this embodiment with a particular form which simply enables an adjusting element introduced before folding in the form of a dielectric tuning strip 80 which is endlessly rolled onto the manufacturing strip with variable tracking both for adjustment of the resonant circuit capacitance and as a selective additional insulating layer in the regions of mutually crossing conductor paths of various sheets to be used in such a way that all crossovers 99 are distributed substantially in the manufacturing strip direction along one longitudinal edge of such a tag. Analogously, also in this embodiment, the conductor path construction can be made from a pure metal foil in so far as a relatively thin capacitor foil 84 which is laminated in longitudinally of the manufacturing strip as a capacitively effective dielectric 9 mutually separates superimposed conductor path parts on crossover-locations 99, as shown (in a similar way) in FIG. 16 and FIG. 7.

FIG. 20 shows a schematic representation for explanation of the principle of a circular conductor path construction which permits a further embodiment of the invention. Such constructions can be manufactured —preferably in the frequency range 10 MHZ to 500 MHZ —in that two or more flat conductor path constructions 100 and 101 consisting of circular elements are positioned on each other with changeable covering in the peripheral direction and with insulating interposition at least of one dielectric layer so that the two capacitors 102 and 103 result and by simple changing of a positional angle 104 before the folding an adjustment of the resonant frequency of the finished construction is possible within particularly wide boundaries. The corresponding equivalent circuit diagram to the conductor path construction represented in FIG. 20 is shown in FIG. 21.

Such constructions can be manufactured analogously to the already described embodiments moreover in that corresponding to FIG. 22 two circular conductor path constructions 100 and 101 are placed on a processing carrier 7 equipped with a sealing layer 6, this carrier being folded together with the conductor path constructions located thereon longitudinally of a perforation or fold-line 8 exactly determined for the placement of the conductor path constructions and the two conductor path structures are held at a definite geometric spacing from one another by an interposed dielectric foil 9. The particular interposition of such a dielectric foil can analogously also be omitted if at least one of the conductor path constructions is manufactured from a metal foil which is already dielectrically coated. The outer boundary of such a tag-like construction can thereby be shaped circular by round stamping from the manufacturing strip. In this combination, unnecessary stamping waste can, analogously to FIG. 11, be removed so that for example round self-adhesively coated labels are manufacturable at intervals in an endless sequence on a separating paper strip.

Figure 23:
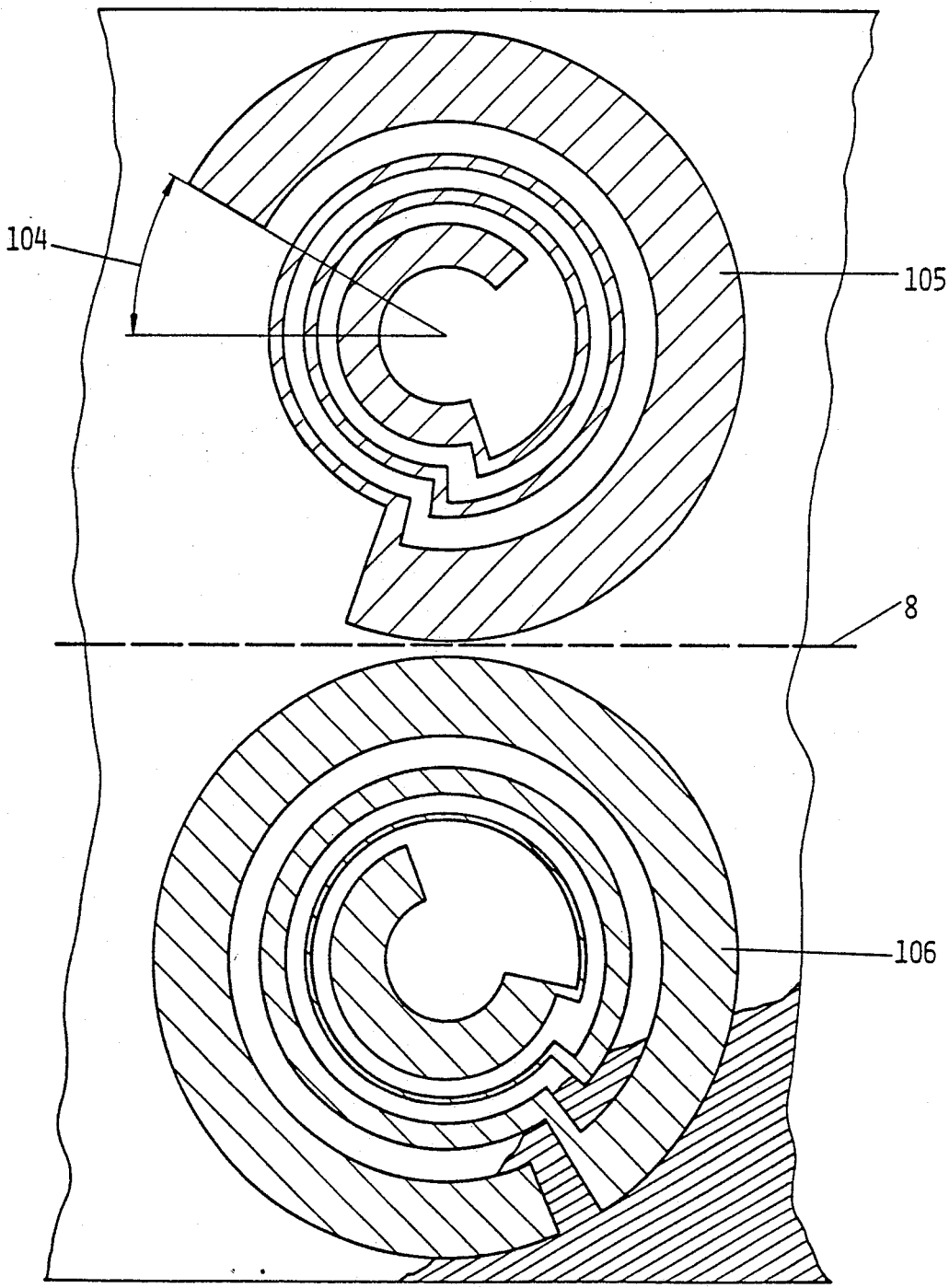
FIG. 23 shows a schematic representation of a further embodiment of the invention having a plurality of substantially annular mutually overlapping windings of the conductor paths and simpler adjustability of the resonant frequency.

As may be seen from FIG. 23, also with circular conductor path constructions the method upon folding together of section-wise reciprocally superimposed and overlapping conductor paths is usable in order to achieve substantial invariance of the resonant frequency in respect of positioning exactitude upon folding. FIG. 23 shows in this connection an embodiment in which the metallizing exceeding the fold-over line 8, i.e. a conductive connection of the conductor paths divided on the two sheets is replaced by a capacitive coupling of the inductive part constructions, realized by a particularly large surface of the outermost conductor paths 105 and 106, corresponding to the equivalent circuit in FIG. 21. Also in this connection by simple change of a positioning angle 104 before folding, the resonant frequency of the finished construction can be predetermined within wide limits.

Figure 24:
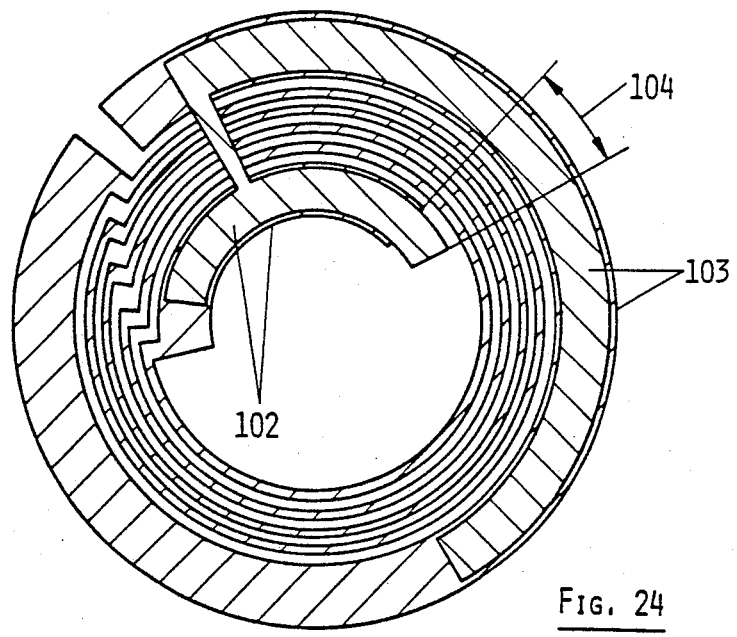
FIG. 24 shows a schematic representation of a further embodiment of the invention having a plurality of substantially annular windings of the conductor paths and adjustability of the resonant frequency within particularly wide limits.

A corresponding embodiment of the tag-like construction according to the invention having single-sided inductance achieved substantially in one sheet plane is represented in FIG. 24. In respect of the described adjusting capability of the resonant frequency of manufactured circular constructions, there result with this embodiment particularly wide adjustment limits since the relative capacitance change can be made very large and also a combined inductive-capacitive more effective adjustment is possible.

Figure 25:
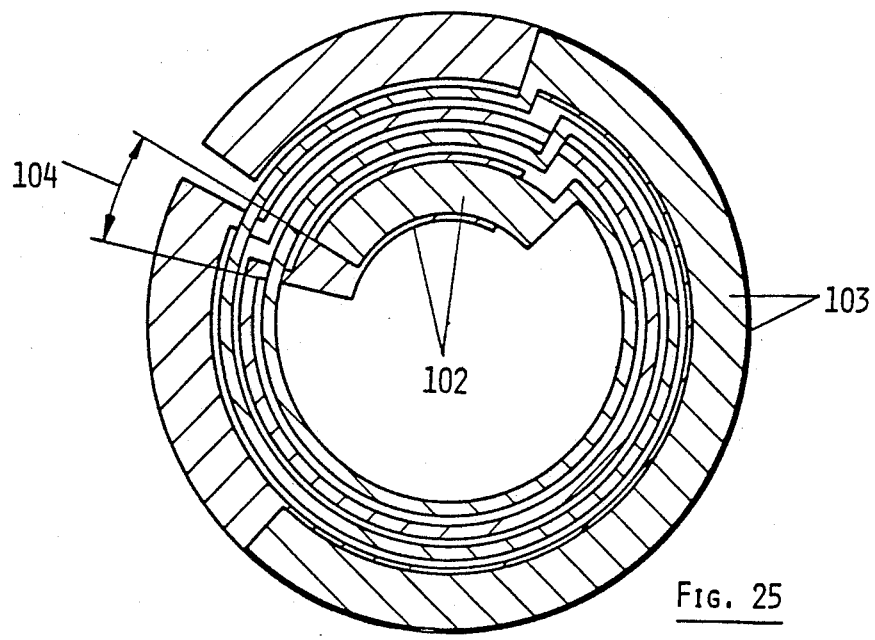
FIG. 25 shows a schematic representation of a further embodiment of the invention having a plurality of substantially annular windings of the conductor paths which are enclosed within each other and adjustability of the resonant frequency within particularly wide limits.
Figure 26:
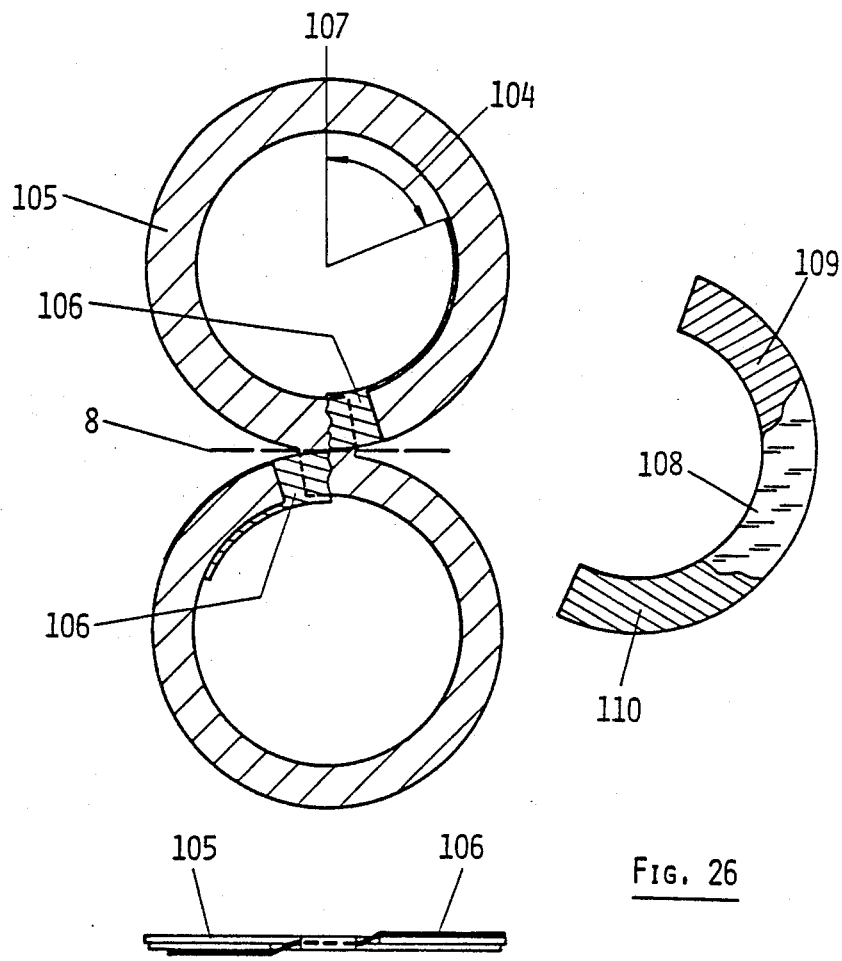
Figure 27:
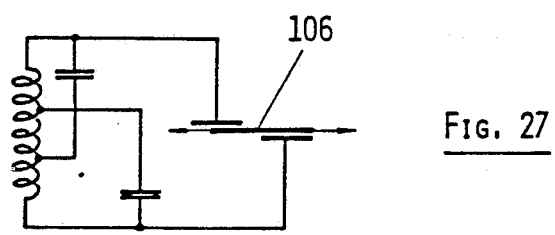

A corresponding embodiment of the tag-like construction according to the invention having alternately spiral mutually enclosed windings of the inductive construction divided into two sheet planes is represented in FIG. 25. In respect of the adjustment possibility of the resonant frequency of such finished circular constructions, the comments made in respect of FIG. 24 apply.

In each case embodiments of the tag-like construction according to the invention can be modified with the result that selectively either the "inner" or "outer" capacitance—corresponding to the capacitances 102 and 103 in FIGS. 21, 24 and 25, are constructed substantially without change upon adjustment. However also both capacitances—for example by suitable construction of the outline of the conductive surfaces producing it—can be so manufactured that they enable the desired setting of the resonant frequency of such constructions in cooperation with one another.

Figure 26A:
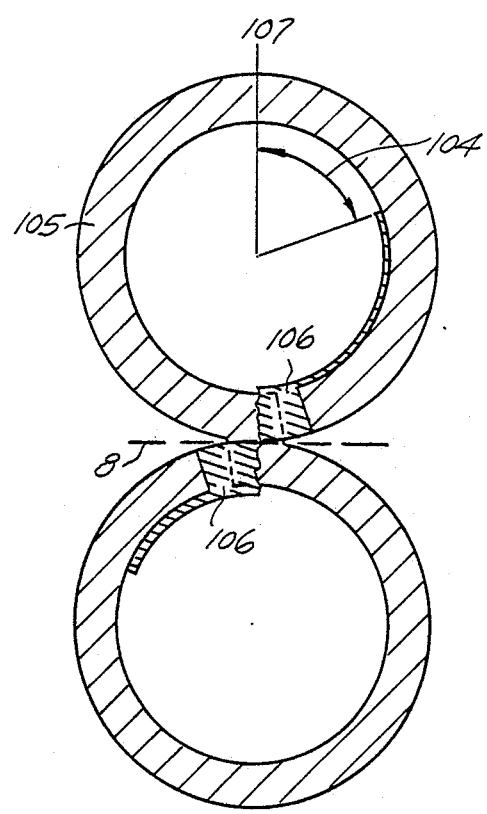
FIGS. 26a–26c show a schematic representation of a further embodiment of the invention having substantially annular mutually overlapping windings of the conductor paths and of electrical connection through the fold-line.
Figure 27:
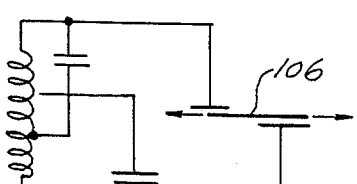
FIG. 27 shows an equivalent circuit diagram of the embodiment according to FIG. 26.

As can be seen from FIG. 26a, in a similar manner also flat structures can be used which consist of one flat conductor path construction 105 divided but connected into two sheet planes, i.e. have a conductive connection through the perforation or fold-line 8 of the carrier material, so that the individual sheets are electrically conductively connected together. The associated equivalent circuit diagram is shown in FIG. 27. Fundamentally, all described embodiments with an electrically conductive connection through a folding or perforation zone can be manufactured even with substantially circularly running conductor path contours.

Figure 26B:
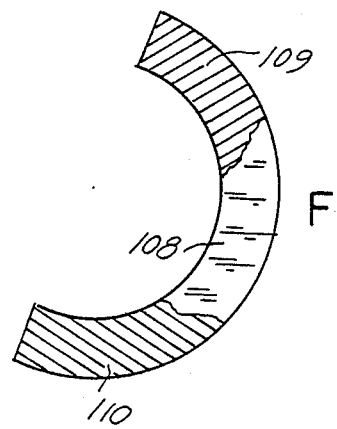
Figure 26C:

In such constructions according to FIG. 26c after the folding an adjustment of the resonant frequency can take place by introduction of at least a second flat, possibly circular, metallic conductive tuning construction 106 which represents a capacitive coupling element in the form of a tuner according to FIG. 27 whose positioning angle 104 related to a reference center line 107 of the construction to be folded together determines the resonant frequency of such a construction. In the positioning of such a construction use can be made of the fact that the same resonant frequency is adjustable in two different positions of the tuner. The tuner itself can be made from a metallic blank or also from a dielectrically coated foil depending upon whether the conductor path construction is made only from a one-sided or two-sided dielectrically coated foil or whether—for example upon use of etching methods for the manufacture—the particular introduction of throughgoing dielectric layers is provided. In the same way, particular tuning characteristics can be achieved in that the tuner is manufactured from a metal foil which is equipped on both sides with various isolating layers 109 and 110 both in respect of the thickness and also in respect of the dielectric properties, such as is illustrated in FIG. 26b.

Figure 28:
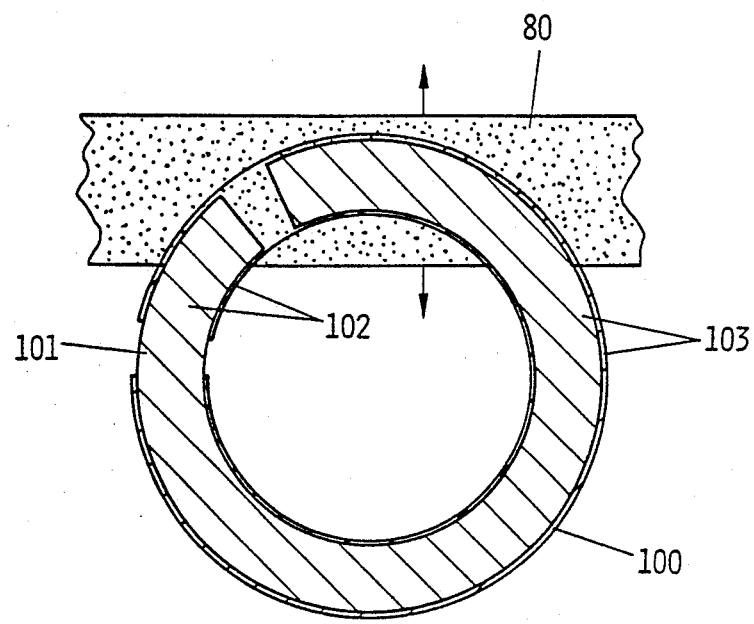
FIG. 28 shows a schematic representation for explanation of the adjusting of the resonant frequency of embodiments according to the invention having substantially annularly extending conductor paths by means of an interposed dielectric tuning strip.

According to FIG. 28, also with embodiments having essentially circularly running conductor paths 100 and 101, an adjustment of the resonant frequency can be achieved in that a dielectric adjusting element—preferably in the form of an adjusting tape 80 endlessly laminated into the manufacturing strip—is placed on the flat conductor path construction before folding. In this way it is possible to achieve a practical adjustment curve by simultaneous adjustment of at least two capacitances, in that the conductor path construction is positioned suitably on the manufacturing strip in respect of the direction of advancement of the same such as is illustrated in FIG. 28.

Figure 29:
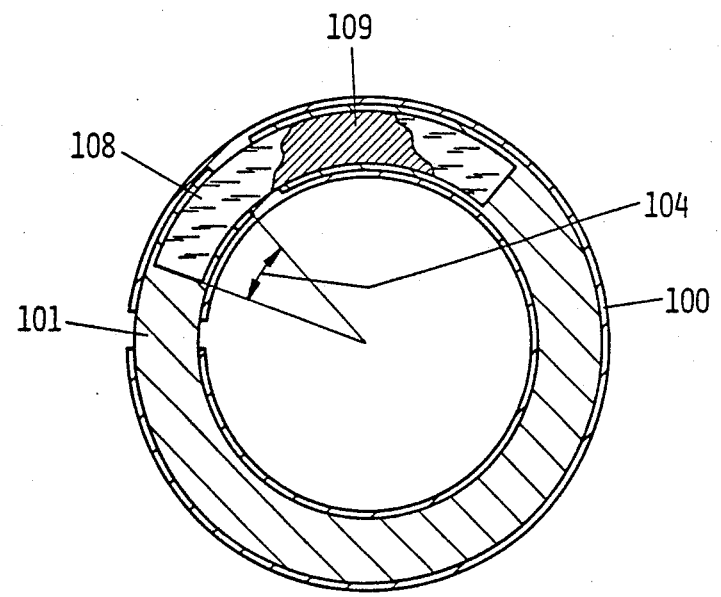
FIG. 29 shows a schematic representation for explanation of the adjustment of the resonant frequency of embodiments according to the invention having substantially annularly extending conductor paths by means of an electrically conducting strip-like adjusting construction which is flat and dielectrically separated from the conductor paths, this method being applicable also to substantially rectangular conductor path constructions.

FIG. 29 shows a modified way of use of an additional metallic conductor path piece insulated from circular conductor path constructions 100 and 101, this conductor path piece serving as a frequency adjusting tuner which can be made from a pure metal foil 108 or from a metal foil 108 provided with a dielectric layer 109 on at least one side, in each according to whether the folded conductor path construction is outwardly blank or is covered by a dielectric layer. Tuning of frequency adjustment is also possible here by hanging of the position angle 104 of the capacitively effective adjusting tuner. In a similar way, this type of frequency adjustment can be used also in rectangular embodiments of such tags if instead of a circularly curved conductor path piece a substantially linearly extended conductor path piece is used as adjusting element, which permits a tuning of the resonant frequency by changing of a linear positioning dimension.

It is important that all embodiments having substantially circular periphery and substantially circularly extending conductor paths can be manufactured in the same manner as those which are essentially rectangular.

Figure 30:
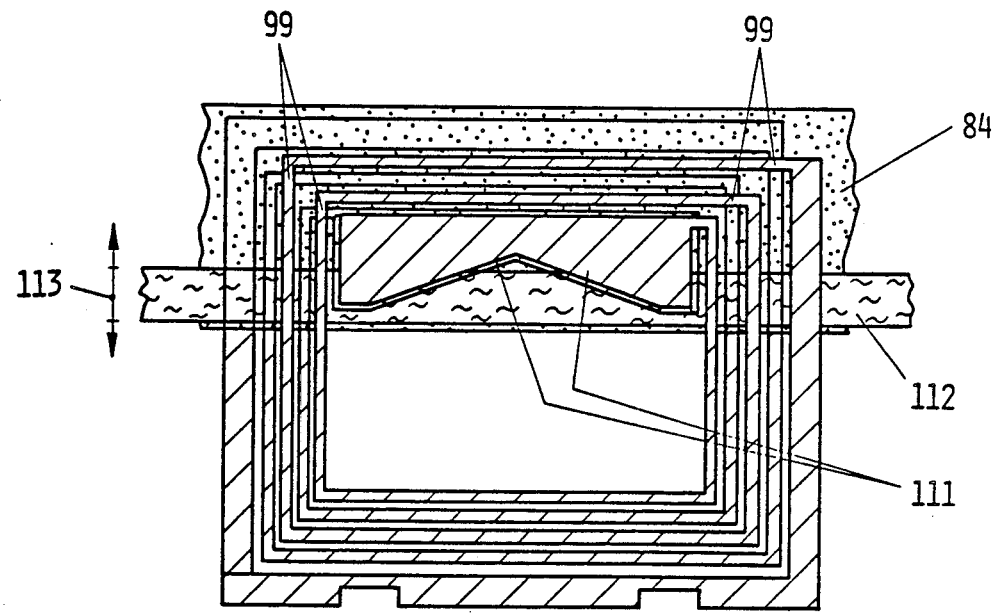
FIG. 30 shows a schematic representation of a modified embodiment of the invention according to FIG. 15 and FIG. 16.
Figure 31:
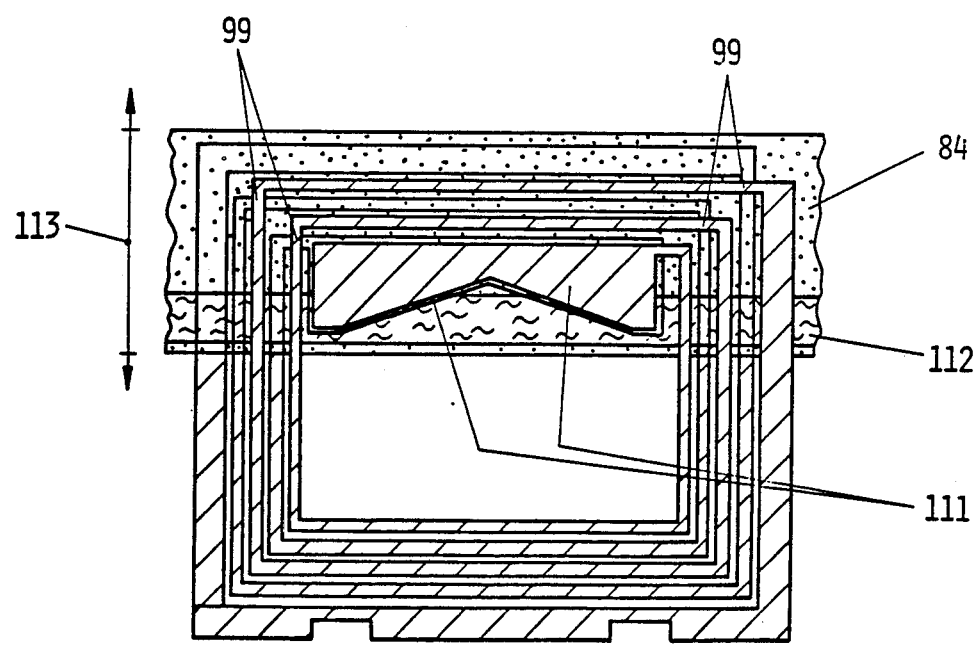
FIG. 31 shows a schematic representation of a further modified embodiment of the invention according to FIG. 15 and FIG. 16.

Preferably if the described arrangements according to the invention are manufactured from conductor path constructions which are either stamped out of pure metal foil or however were obtained by etching from a carrier material which cannot be used as a capacitor dielectric, in suitable embodiments of conductor path cross-overs 99 and capacitively effective surfaces 111 according to FIG. 30 the functions of the capacitor dielectric and of an insulating medium between conductor path cross-overs can be realized by a suitable first tape 84 which can be consecutively introduced on the manufacturing strip provided with conductor path constructions, whilst the function of an adjusting element can be realized by a suitable second tape 112 continuously introduced either on the tape 84 already introduced onto the manufacturing strip or however onto that one of capacitor layers 111 which is still not covered thereby.

Expediently, it has proved that first the actual capacitor foil 84, mutually separating by the cross-overs 99, is introduced at a fixed track on the still unfolded conductor path construction and finally the tuning tape 112 is positioned, this positioning being performed track-variable with respect to a tuning direction 113.

On the other hand, according to FIG. 30 however, in a particular process a capacitor foil 84 can be connected to an adjusting tape 112 of suitable dielectric properties to form a unitary construction so that longitudinally of the path direction at least two mutually separating zones of various thickness and dielectric properties result. If this two-layered tape is positioned as a one-piece track-variably with respect to an adjusting or tuning direction 113, on the manufacturing strip provided with conductor path constructions so that the zone of smaller thickness in each case ensures the insulation of mutually crossing conductor paths, and the zone of larger thickness, and its track position relative to the strip in cooperation with the contour of capacitively effective conductor path surfaces 111 produces an influence on the effective capacitance, such a connected construction from the parts 84 and 112 achieves the insulation of conductor path crossings, the manufacture of a resonant circuit capacitance and the adjustment of the resonant frequency of an identification arrangement manufactured in such manner.

Figure 32:
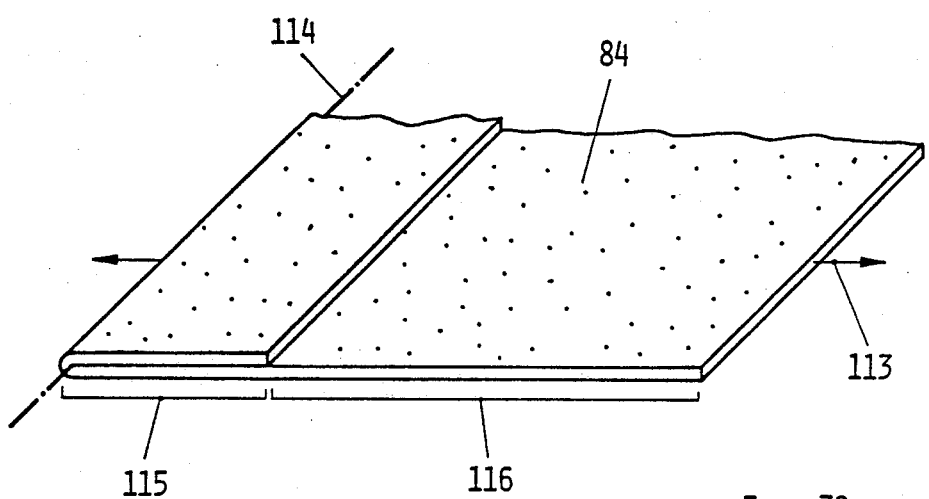
FIG. 32 shows a schematic representation of a dielectric strip manufactured by folding which allows frequency adjustment of the arrangements according to the invention in a particularly simple manner.

According to FIG. 32, for the same purpose also a tape-like conveyed capacitor foil 84 can be so folded before the application to the conductor path construction on one side longitudinally of a fold-line 114, that a strip-shaped material of constant dielectric properties results, which has two zones 116 and 115 of single and double thickness. The placing of such a one-sided folded capacitor dielectric on the conductor path construction in the same way allows the insulation of conductor path cross-overs, the manufacture of a resonant circuit capacitance and the adjustment of the resonant frequency of an identification arrangement manufactured in such manner if such a folded capacitor foil is introduced between capacitively effective conductor path surfaces 111 track-variable with respect to the adjusting direction 113.

In order to shorten the description, not all variations of the various embodiments have been described or illustrated. For the expert it is however immediately apparent that a series of variations of an embodiment can be realized even in other embodiments in so far as the need exists on economic or other grounds.

I claim:

1. An identification device in the form of a flat tag-like construction affixable to an object, comprising:
    a flexible planar, nonconductive substrate;
    a longitudinally extending central conductive path affixed to said substrate including a perforation substantially oriented through the center thereof forming a foldline about which said substrate and said central path may be folded;
    a conductive first element, in electrical communication with said central path, comprising an inductive element formed of flat, connected, conductive paths affixed to said substrate and disposed on one side of said foldline,
    a conductive second element, in electrical communication with said central path, affixed to said substrate on an opposite side of said foldline and registered relative to said first conductive element;
    a dielectric element disposed over at least a portion of one of said conductive elements; said first and said second conductive elements forming upon the folding over of said substrate about said foldline, in a manner to place said first and said second conductive elements in an opposing aligned relation, a resonant circuit comprising inductive and capacitive elements.

2. The device as defined in claim 1 wherein said first element comprises a first path comprising a plurality of connected, conductive first segments of predetermined first length and first width forming a first spiral path and wherein the spacing between adjacent, spaced path parts or segments are at predetermined first intervals; and wherein
    said second element comprises a second path comprising a like plurality of connected, conductive second segments of predetermined second length and second width forming a second spiral path and wherein the spacing between adjacent, spaced path parts or segments are at predetermined second intervals wherein said second width of each said second segment is less than said first width of each corresponding one of said first segments such that upon the folding over of said substrate said first segments completely overlap said second segments.

3. The device as defined in claim 2 wherein the innermost conductive segment of said second spiral path is wider than any of the other of said second segments and forms in cooperation with a corresponding innermost segment of said first spiral opposingly oriented plates of a discrete capacitor.

4. The device as defined in claim 1 wherein said first conductive element comprises a first path comprising a plurality of connected, conductive first segments of predetermined first length and first width forming a first spiral path and wherein the spacing between adjacent, spaced segments are at predetermined first intervals; and wherein
    said second conductive element comprises a second path comprising a like plurality of connected, conductive second segments of predetermined second length and second width forming a second spiral path and wherein the spacing between adjacent, spaced segments are at predetermined second intervals and wherein said first widths of the segments of said first spiral are narrower than said second intervals, defining the spacing of said second spiral path and registered relative thereto such that upon the folding over of said substrate said first segments lie within said second intervals.

5. The device as defined in claim 4 wherein upon the folding over of said substrate certain of said first segments are caused to overlap certain of said second segments and wherein said dielectric element is only disposed between those portions of said first and second segments which overlap one another.

6. The device as defined in claim 5 wherein the innermost conductive segments of said first and said second spiral paths are wider than any of the other of said first and second segments thereby forming in cooperation with one another opposingly oriented plates of a discrete capacitor and wherein said dielectric element is further disposed between said plates.

7. The device as defined in claim 6 wherein said plates include means for reducing eddy current flow comprising at least one notch or slit.

8. The device as defined in claim 4 wherein said dielectric element is a continuous insulative strip extending over the full length of the identification device and having a strip width less than 50% of the full width of the identification device.

9. The identification device according to claim 4, further comprising:
an additional dielectric element having the shape of a strip and extending at least in part between said first and second conductive elements in at least one place in which first and second conductor strip portions cross over one another.

10. The identification device according to claim 4, wherein
the patterns of said spiral conductive paths and said spiral spacing paths are designed such that crossovers of said first and second conductor strip portions are located in the peripheral vicinity of said capacitive member.

11. The device as defined in claim 1 wherein said first conductive element comprises a first path comprising a plurality of connected, conductive first segments of predetermined first length and first width forming a first spiral path and wherein the spacing between conductive adjacent segments are at first predetermined intervals; and wherein the innermost of said segments is a first tapered segment, and wherein
said second conductive element comprises a conductive second tapered segment registered relative to said first tapered segment;
said first and said second tapered segments cooperating, upon the folding over of said substrate, to form the plates of a discrete capacitor, and
dielectric adjusting means disposed parallel to said central path and of length at least equal thereto and positioned proximate the narrower portions of said tapered segments and controllably movable towards the wider portions of said tapered segments for adjusting the capacitance of said discrete capacitor.

12. The device as defined in claim 1 further including at least one opening disposed through said central path about said foldline.

13. The device as defined in claim 12 further including at least one opening disposed through said central path and said substrate and positioned about said foldline to form a notch upon the folding over of said substrate.

14. The device as defined in claim 1 wherein said perforation is centered at said foldline and defines, along said foldline, an elongated region in said central conductive path in which said central conductive path is predominantly absent.

15. An identification device in the form of a flat tag-like construction affixable to an object comprising:
a flexible planar, nonconductive substrate defining a foldline about which said substrate may be folded;
a first conductive element, comprising an inductive element formed of flat, connected, conductive paths affixed to and disposed on one side of said foldline,
a second conductive element, affixed to said substrate on an opposite side of said foldline and registered relative to said first conductive element;
a dielectric element disposed over at least a portion of one of said conductive elements; said first and said second conductive elements forming upon the folding over of said substrate about said foldline, a resonant circuit comprising inductive and capacitive elements wherein said first conductive element comprises a first path comprising a plurality of connected, conductive first segments of predetermined first length and first width forming a first spiral path and wherein the spacing between adjacent, spaced segments are at first predetermined intervals; and wherein
said second element comprises a second path comprising a like plurality of connected, conductive second segments of predetermined second length and second width forming a second spiral path and wherein the spacing between adjacent, spaced segments are at predetermined second intervals and wherein upon the folding over of said substrate about said foldline said plurality of first segments are mutually aligned to the plurality of second segments thereby forming pairs of segments and wherein said first and said second widths are chosen such that an overlapping is formed of said first segments relative to said second segments which sequentially alternates for each said pair of segments between said first spiral path and said second spiral path.

16. The device as defined in claim 15 wherein said first and second spiral paths are rectangular and wherein the overlap of each of said pairs of segments is more pronounced for said pairs disposed parallel to said foldline than for said pairs disposed at right angles to said foldline.

17. The device as defined in claim 16 further including a longitudinally extending central path affixed to said substrate over said foldline including a perforation substantially oriented through the center thereof forming said foldline about which said substrate may be folded and wherein said central path is in electrical communication with said first and second conductive elements.

18. The device as defined in claim 17 wherein the innermost conductive segments of said first and said second spirals are wider than any of the other of said first and second segments thereby forming in cooperation with one another opposingly oriented plates of a discrete capacitor.

19. The device as defined in claim 17 further including at least one opening disposed through said central path about said foldline.

20. The device as defined in claim 19 further including at least one opening disposed through said central path and said substrate and positioned about said foldline to form a notch upon the folding over of said substrate.

21. The device as defined in claim 17 wherein said perforation is centered at said foldline and defines, along said foldline, an elongated region in said central conductive path in which said central conductive path is predominantly absent.

22. A circular resonant tag device comprising:
a flexible, nonconductive substrate;
a resonant circuit affixed to said substrate comprising:
a first conductive member affixed to said substrate on one side thereof comprising a flat, arcuately shaped first element including a first set of spaced circumferential ends;
a second conductive member affixed to said substrate, in registration with said first conductive member, comprising a flat second arcuately shaped element including a second set of spaced circumferential ends;
said second conductive member being registered and rotated to said first conductive member such that upon vertical alignment of said first and second conductive members said first and second arcuately shaped elements are substantially mutually aligned and said first and second sets of spaced circumferenced ends are rotationally positioned relative to one another by a predetermined amount such that said first and second arcuately shaped elements overlap each other in at least two common areas forming a plurality of plates for at least two distinct capacitors, and a dielectric layer interposing said common or overlapping areas.

23. The device as defined in claim 22 wherein said first and second conductive members further include a respective plurality of registered and relatively rotated, connected partial circular inner elements of decreasing diameter and of predetermined width.

24. The device as defined in claim 23 wherein the circular inner elements of one of said first or said second conductive members is aligned to the spaces between the circular inner elements of the other of said first or second conductive members.

25. The device as defined in claim 23 further including means for adjusting the resonant frequency of the resonant tag including a partially circular conductive member positioned between said first and second conductive members.

26. The device as defined in claim 22 wherein said first and said second conductive members are electrically connected about the foldline.

27. The device as defined in claim 22 wherein said substrate includes a longitudinally extending foldline about which said substrate may be folded and wherein said first and second arcuately shaped elements are partially circular in shape and positioned about respective sides of said foldline such that upon folding of said substrate about said foldline said first and second elements are substantially mutually aligned.

28. A method of constructing a resonant circuit in the form of a flexible, planar tag comprising the steps of:
   a. providing a flexible, non-conductive substrate;
   b. depositing on said substrate a conductive central path;
   c. perforating said central path to form a longitudinally extending foldline,
   d. deposition on said substrate, on one side of said central path, in electrical communication therewith a conductive first element;
   e. depositing on said substrate, on the other side of said central path, in electrical communication therewith, a conductive second element registered relative to said first element;
   f. folding over said substrate about said foldline to place said first and second elements in a mutually aligned opposing relation;
   g. providing a dielectric insulating layer between predetermined portions of said first and second elements.

29. The method as defined in claim 28 including:
a. disposing a sealing material on said substrate and
b. sealing said substrate after it has been folded over.

30. The method as defined in claim 29 including:
providing at least one cut-out in said central path which forms at least one corresponding notch upon the folding over of said substrate.

31. The method as defined in claim 30 including:
a. transporting the folded over substrate by engaging said at least one notch;

b. positioning said folded over substrate relative to a means for cutting; and
c. cutting away at least excess substrate material from the conductive portions thereon.

32. The method as defined in claim 28 wherein the step of perforating includes causing said perforations to extend through said substrate.

33. The method as defined in claim 28 wherein said foldline is defined at the center of a repetitive perforation in at least a central conductive path, which repetitive perforation defines, along said foldline, an elongated region in which said central conductive path is predominantly absent.

34. The method as defined in claim 28 further including the step of positioning the conductive path pattern by way of slots or notches in said central path or in capacitor plates by means of scanning electromagnetic energy barriers.

35. For use in electronic security and control systems an identification device in the form of a tag-like strip affixable to an article, comprising:
   an insulative, flexible substrate;
   a first conductive element consisting of various first flat conductor strip portions which in a series connection form a first flat conductive spiral pattern affixed to said substrate and including first multiple turns;
   a second conductive element consisting of various second flat conductor strip portions which in a series connection form a second flat conductive spiral pattern affixed to said substrate and including second multiple turns;
   said first and second flat conductive spiral patterns being electrically insulated from each other and oppositely wound with respect to each other and registered in an opposing and aligned relationship to each other;
   a dielectric element in the form of a thin insulative layer extending at least between said first and second flat conductor strip portions of said first and second conductive spiral patterns and disposed therebetween for dielectrically spacing at least respective facing parts of said first and second conductive elements;
   said oppositely wound first and second multiple turns of said respective first and second flat conductive spiral patterns cooperating to form an inductive member and in mutual opposition overlying parts of said first and second conductive elements spaced by said dielectric element forming a capacitive member of a substantially planer resonant circuit which thus has both its inductance and capacitance distributed in a strip-line manner.

36. The identification device according to claim 35, wherein both the innermost and outermost conductor strip portions representing respective ends of said first and second conductive elements are wider than any one of the other conductor strip portions of said first and second conductive elements and in cooperation form with respective innermost and outermost conductor strip portions of the respective other conductive element opposingly oriented plates of loading capacitors.

37. The identification device according to claim 35, wherein said dielectric element is formed at least of a planar dielectric path configured at least as an insulative spiral pattern having an outline which is congruent to the outline of one of said first and second conductive spiral patterns, thus representing the effective dielectric of a capacitive member which is distributed along said multiple turns of said first and second conductive spiral patterns.

38. The identification device according to claim 35, wherein said first conductive element comprises a first conductive path formed by plurality of serially connected first conductor strip portions having individual first lengths and first widths and being arranged to form a first conductive spiral pattern having first multiple turns and wherein the spacing between adjacent conductor strip portions are at predetermined first intervals;

said second conductive element comprises a second conductive path formed by a like plurality of serially connected second conductor strip portions having individual second lengths and second widths and being arranged to form a second conductive spiral pattern having second multiple turns and wherein the spacing between adjacent conductor strip portions are at predetermined second intervals, and wherein any second width of each of said second conductor strip portions is less than any first width of each corresponding one of said first conductor strip portions which each together form a pair of conductor strip portions, and the alignment of said first and second flat conductive spiral patterns in opposition to each other is selected such that first or wider conductor strip portions cover respective second or narrower conductor strip portions with a predetermined marginal overlap, respective overlying conductor strip portions of said first and second spiral patterns thus forming dielectrically spaced conductor strip pairs which in a serially connected relationship form concentrically arranged strip-line loops.

39. The identification device according to claim 35, wherein said first conductive element comprises a first conductive path formed by a plurality of serially connected first conductor strip portions having individual first lengths and individual first widths and being arranged to form a first conductive spiral pattern having first multiple turns and wherein the spacings between adjacent conductor strip portions are at predetermined first intervals, and wherein said second conductive element comprises a second conductive path formed by a like plurality of serially connected second conductor strip portions having individual second lengths and individual second widths and being arranged to form a second conductive spiral pattern having second multiple turns wherein the spacings between adjacent conductor strip portions are at predetermined second intervals, and the alignment of said first and second flat conductive spiral patterns in opposition to each other is such that wider conductor strip portions of said first and second flat conductive spiral pattern cover respective narrower conductor strip portions of the respective other flat conductive spiral pattern; and wherein the individual widths of first and second conductor strip portions are chosen such that an overlapping is formed of said first conductor strip portions relative to said second conductor strip portions which subsequently alternate for corresponding pairs of first and second conductor strip portions between said first conductive path and said second conductive path in a predetermined sequence.

40. The identification device according to claim 35 comprising:

a line of perforations formed in said substrate and dividing said substrate into two adjacing portions, said line of perforations running between said first and second flat conductive spiral patterns;

said first conductive spiral pattern being affixed to one portion of said substrate on one side of said line of perforations such that each of said various first flat conductor strip portions is in a precise and defined registration relative to said line of perforations formed in said substrate;

said second conductive spiral pattern being affixed to the opposite portion of said substrate on the opposite side of said line of perforations such that each of said various second flat conductor strip portions is in a precise and defined registration relative to said line of perforations, said line of perforations defining a foldline about which said portions of said substrate may be folded onto each other; and wherein said registration is arranged such that upon folding over said substrate about said foldline, to place respective first and second conductor strip portions in opposition spaced by said dielectric element to form individual strip-line portions forming planar individual resonant circuits composed of various individual strip-line portions.

41. The identification device according to claim 35, wherein said first and second flat conductive spiral patterns are electrically connected at their outermost ends.

42. The identification device according to claim 41, wherein said dielectric element is formed at least of a planar dielectric path configured at least as an insulative spiral pattern having an outline which is congruent to the outline of one of said first and second conductive spiral patterns, thus representing the effective dielectric of the capacitive member which is distributed along said multiple turns of said first and second conductive spiral patterns.

43. The device as defined a claim 35 wherein at least conductive strip portions representing first ends of said first and second spiral path patterns are wider than any of the not ended and spiralling conductor strip portions of said first and second conductive spiral path patterns and in cooperation with said dielectric element form opposingly oriented plates of at least one discrete low inductance loading capacitor.

44. The use in electronic security and control systems an identification device in the form of a tag-like strip affixable to an article, comprising:

an insulative, flexible substrate;

a first conductive element comprising a first conductive pattern formed of various first flat conductor strip portions which in a series connection form a flat conductive spiral path affixed to said substrate and having multiple turns and forming an inductive member; and two second flat conductor strip portions affixed to said substrates and representing the innermost and outermost portions of said flat conductive spiral path;

a second conductive element comprising a second conductive pattern formed of two third flat conductor strip portions and a fourth flat conductor strip portion electrically connecting said third flat conductor strip portions one to another;

said first and second conductive elements being electrically insulated from each other and arranged in a registrated relationship to each other such that each one of said third conductor strip portions of said second conductive pattern is, at least in part, aligned in mutual opposition with a respective one of said second flat conductor strip portions of said first conductive pattern;

a dielectric element in the form of a thin insulative layer extending at least between said third and second and between said fourth and first flat conductor strips portions, insulatively spacing said second and first conductive patterns one from another, and wherein said dielectric element, in cooperation with said second and third conductor strip portions, form a capacitive member of a substantially planar resonant circuit.

45. The identification device according to claim 44, wherein: the shape of said first conductive pattern is substantially circular; and wherein said second and third conductor strips portions are formed by circular segments.

46. For use in electronic security and control systems an identification device in the form of a tag-like strip affixable to and article, comprising an insulative, flexible substrate;

a line of perforations formed in said substrate and dividing said substrate into two adjacent portions;

a first conductive element, comprising a first conductive pattern formed of a plurality of first flat conductor strip portions which in a series connection form a flat conductive spiral path having multiple turns and forming an inductive member, including two second flat conductor strip portions representing the innermost and outermost portions of said flat conductive spiral paths, each of said first and second flat conductor strip portions being affixed to one portion of said substrate on one side of said line of perforations in a precise and defined registration relative to said line of perforations;

a second conductive element comprising a second conductive pattern formed of two third flat conductor strip portions and a fourth flat conductor strip portion electrically connecting said third flat conductor strip portions one to another;

each of said third and fourth flat conductor strip portions being affixed to the opposite portion of said substrate on the opposite side of said line of perforations in a precise and defined registration relative to said line of perforations; said line of perforations defining a foldline about which said portions of said substrate material may be folded onto each other;

a dielectric element in the form of a thin insulative layer extending at least over a portion of one of said conductive elements; and wherein said first and second conductive elements form, upon folding over said substrate about said foldline in a manner to place said respective second and third conductor strip portions in an opposing aligned relationship to each other spaced by said dielectric element, a resonant circuit comprising inductive and capacitive elements.

47. Identification device according to claim 46, wherein said line of perforations in said substrate is at least in part removed after the performance of the folding over of said substrate material.

48. For use in electronic security and control systems an identification device in the form of a tag-like strip affixable to an article, comprising;

an insulative, flexible substrate;

a first conductive element affixed to said substrate and comprising a plurality of serially connected first flat conductor strip portions having individual first lengths and first widths and being arranged to form a first flat conductive spiral path having first multiple turns and running from a first innermost to a first outermost conductor strip portion and wherein the spacings between adjacent conductor strips are at predetermined first intervals and define a first spiral spacing path;

a second conductive element comprising a like plurality of serially connected second flat conductor strip portions having individual second lengths and second widths and being arranged to form a second flat conductive spiral path having second multiple turns and running from a second innermost to a second outermost conductor strip portion and wherein the spacings between adjacent conductor strips are at predetermined second intervals and define a second spiral spacing path;

a dielectric element in the form of a thin insulative layer extending over at least a portion of one of said conductive elements; wherein said first widths of said first conductor strip portions are narrower than said second intervals, wherein said second widths of said second conductor strip portions are narrower than said first intervals;

wherein said first and second conductor strip portions substantially lie within said second and first respective intervals, thus providing said first conductive spiral path to interlace with said second conductive spiral path to form an inductive member having both first and second multiple turns arranged substantially in a single plane and having an extremely low leakage capacitance, wherein at least one respective pair of both innermost and outermost conductor strip portions of said first and second conductive spiral paths is wider than any one of the other conductor strip portions of said first and second conductive spiral paths and are, at least in part, registrated in a mutually aligned opposition, one strip portion to the other, and in cooperation with said dielectric element spacing one from another forms plates of a discrete capacitive member; and said inductive and capacitive member forming a planar resonant circuit.

49. The identification device according to claim 48, further comprising:

an additional dielectric element having the shape of a strip and extending at least in part between said first and second conductive elements in at least one place in which first and second conductor strip portions cross over one another.

50. The identification device according to claim 48, wherein the patterns of said spiral conductive paths and said spiral spacing paths are designed such that crossovers of said first and second conductor strip portions are located in the peripheral vicinity of said capacitive member.

51. The device as defined in claims 48 wherein said dielectric element in a continuous insulative strip extending over the full length of the identification device and having a strip width less than 50% of the full width of the identification device.

52. The identification device according to claim 48, wherein
said first conductor strip portions are spaced one from another at substantially constant intervals and wherein the ratio of the width of said intervals to the width of said conductive spiral paths is substantially 2.

53. For use in electronic security and control systems, an identification device in the form of a tag-like strip affixable to an article, comprising:
an insulative, flexible substrate;
a longitudinally extending central conductive path affixed to said substrate and including a line of perforations substantially oriented through the center thereof; wherein said central path and said substrate form at least a twin-layer construction, and wherein
said line of perforations forms a foldline about which said substrate and said central path may be folded;
a first conductive element, affixed to said substrate and disposed on one side of said foldline and in electrical communication with said central conductive path, comprising a plurality of first flat conductor strip portions having individual first lengths and first widths, said first flat conductor strip portions in a series connection forming a flat conductive spiral pattern affixed to said substrate and having multiple turns, and wherein each of said flat conductor strip portions is registered relative to said line of perforations;
a second conductive element, affixed to said substrate and disposed on an opposite side of that foldline, and in electrical communication with said central conductive path, and registered relative to said line of perforations;
a dielectric element disposed over at least a portion of one of said conductive elements;
said first and said second conductive elements forming, upon the folding over of said substrate about said foldline in a manner to place said first and said second conductive elements in an opposingly aligned registration one relative to another spaced by said dielectric element, a resonant circuit comprising inductive and capacitive elements.

54. The identification device according to claim 53, wherein
said first conductor strip portions are spaced one from another at substantially constant intervals and wherein the ratio of the width of said intervals to the width of said conductive spiral paths is substantially 2.

55. The device as defined in claims 53 wherein said perforation is centered at said foldline and defines, along said foldline, an elongated region in said central conductive path in which said central conductive path is predominantly absent.

56. A method of constructing a resonant circuit in the form of a flexible, planar tag-like strip comprising the steps of:
a. continuously providing a flexible, insulative substrate having a first and second face;
b. continuously depositing on said first face of said substrate an etchant impervious sealing layer having a resealing capability
c. continuously providing a continuous metal foil having a first and second face;
d. continuously combining said sealantly equipped substrate with said first face of said metal foil;
e. continuously laminating said combination, in a manner to form at least a tri-layered sandwich construction having the resealing layer as a central component, by activating said sealing layer for a first time;
f. continuously providing said sandwich construction with suitable pilot means for repetitionally precise transportation and for folding over said substrate about a foldline;
g. continuously depositing a dielectric material on said second face of said metal foil to form a plurality of dielectric paths thereon forming repetitive etchant resistive mask patterns each of which have an outline which defines the outlines of at least first and second conductor path portions of respective first and second conductive elements to be generated thereon;
h. continuously etching the sandwich construction;
i. continuously drying the etched construction;
k. continuously recreating the sealing capability of said sealing layer in all places in which the metal has been removed by chemically treating the dried construction;
l. continuously folding over the etched and sealingly recreated construction such, that said first and second conductive elements are aligned in an opposing relation one to another and spaced at least by the double width of said dielectric paths of said etchant resistive mask patterns;
m. continuously laminating the folding over construction by activating said sealing layer a second time; and
n. repetitively dividing the folded over and sealed construction into individual resonant circuits which can be washed and sewn.

57. The method as defined in claim 56 wherein said foldline is defined at the center of a repetitive perforation in at least a central conductive path, which repetitive perforation defines, along said foldline, an elongated region in which said central conductive path is predominantly absent.

58. The method as defined in claim 56 further including the step of positioning the conductive path pattern by way of slots or notches in said central path or in capacitor plates by means of scanning electromagnetic energy barriers.

* * * * *